(12) United States Patent
Hersee

(10) Patent No.: US 7,968,359 B2
(45) Date of Patent: Jun. 28, 2011

(54) THIN-WALLED STRUCTURES

(75) Inventor: Stephen D. Hersee, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 222 days.

(21) Appl. No.: 12/237,469

(22) Filed: Sep. 25, 2008

(65) Prior Publication Data

US 2010/0276664 A1 Nov. 4, 2010

Related U.S. Application Data

(63) Continuation-in-part of application No. 11/684,264, filed on Mar. 9, 2007, now Pat. No. 7,521,274.

(60) Provisional application No. 60/780,833, filed on Mar. 10, 2006, provisional application No. 60/798,337, filed on May 8, 2006, provisional application No. 60/808,153, filed on May 25, 2006, provisional application No. 60/889,363, filed on Feb. 12, 2007.

(51) Int. Cl.
*H01L 21/00* (2006.01)

(52) U.S. Cl. .................................... 438/41; 977/816

(58) Field of Classification Search .......... 438/41, 438/479, 46; 977/762, 816, 782, 893
See application file for complete search history.

(56) References Cited

U.S. PATENT DOCUMENTS

| 6,130,142 | A * | 10/2000 | Westwater et al. | 438/478 |
|---|---|---|---|---|
| 6,596,377 | B1 | 7/2003 | Hersee et al. | |
| 6,693,021 | B1 | 2/2004 | Motoki et al. | |
| 7,303,631 | B2 * | 12/2007 | Conley et al. | 117/94 |
| 7,309,621 | B2 * | 12/2007 | Conley et al. | 438/99 |
| 7,445,742 | B2 * | 11/2008 | Chen et al. | 264/293 |
| 7,521,274 | B2 | 4/2009 | Hersee et al. | |
| 2004/0262636 | A1 * | 12/2004 | Yang et al. | 257/200 |
| 2005/0161662 | A1 | 7/2005 | Majumdar et al. | |
| 2006/0021564 | A1 | 2/2006 | Norman et al. | |
| 2006/0073680 | A1 * | 4/2006 | Han et al. | 438/479 |
| 2006/0112466 | A1 * | 5/2006 | Den | 977/762 |
| 2006/0223211 | A1 * | 10/2006 | Mishra et al. | 438/41 |
| 2006/0284187 | A1 * | 12/2006 | Wierer et al. | 257/79 |
| 2007/0001220 | A1 * | 1/2007 | Tombler et al. | 257/330 |
| 2007/0172183 | A1 * | 7/2007 | Wang | 385/125 |
| 2007/0257264 | A1 * | 11/2007 | Hersee et al. | 257/76 |
| 2007/0286945 | A1 * | 12/2007 | Lahnor et al. | 427/80 |

(Continued)

OTHER PUBLICATIONS

Kipshidze et al., "Controlled Growth of GaN Nanowires by Pulsed Metalorganic Chemical Vapor Deposition", Applied Physics Letters 86, 033104 (2005), pp. 033104-1 to 033104-3.

(Continued)

*Primary Examiner* — W. David Coleman
(74) *Attorney, Agent, or Firm* — MH2 Technology Law Group LLP

(57) ABSTRACT

Various embodiments provide thin-walled structures and methodologies for their formation. In one embodiment, the thin-walled structure can be formed by disposing a semiconductor material in a patterned aperture using a selective growth mask that includes a plurality of patterned apertures, followed by a continuous growth of the semiconductor material using a pulsed growth mode. The patterned aperture can include at least one lateral dimension that is small enough to allow a threading defect termination at sidewall(s) of the formed thin-walled structure. In addition, high-quality III-N substrate structures and core-shell MQW active structures can be formed from the thin-walled structures for use in devices like light emitting diodes (LEDs), lasers, or high electron mobility transistors (HEMTs).

20 Claims, 12 Drawing Sheets

U.S. PATENT DOCUMENTS

2008/0073743 A1   3/2008   Alizadeh et al.

OTHER PUBLICATIONS

Mohan et al., "Realization of Conductive InAs Nanotubes Based on Lattice-mismatched InP/InAs Core-shell Nanowires", Applied Physics Letters 88, 013110 (2006), pp. 013110-1 to 013110-3.

Qian et al., "Core/Multishell Nanowire Heterostructures as Multicolor, High-Efficiency Light-Emitting Diodes", Nano Letters 2005, vol. 5, No. 11, pp. 2287-2291.

Deb, Parijat et al., "Faceted and Vertically Aligned GaN Nanorod Arrays Fabricated without Catalysts or Lithography," Nano Letters, 2005, vol. 5, No. 9, pp. 1847-1851.

* cited by examiner

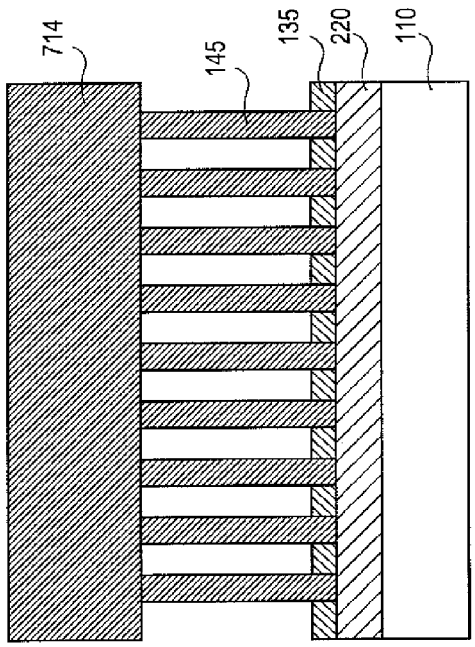
FIG. 7A
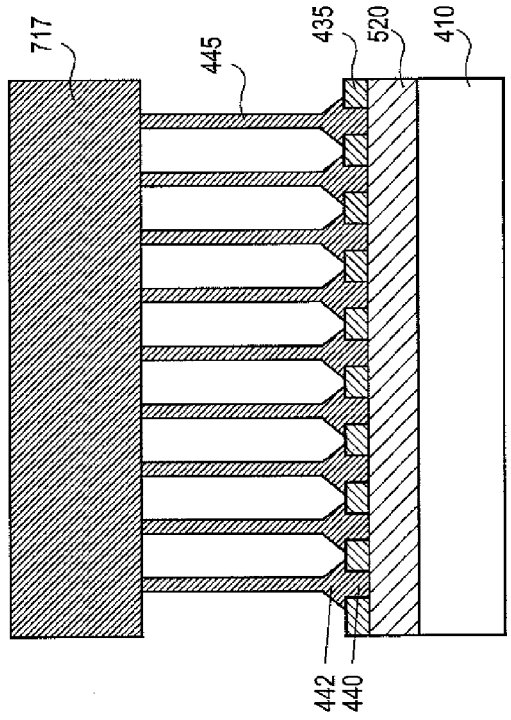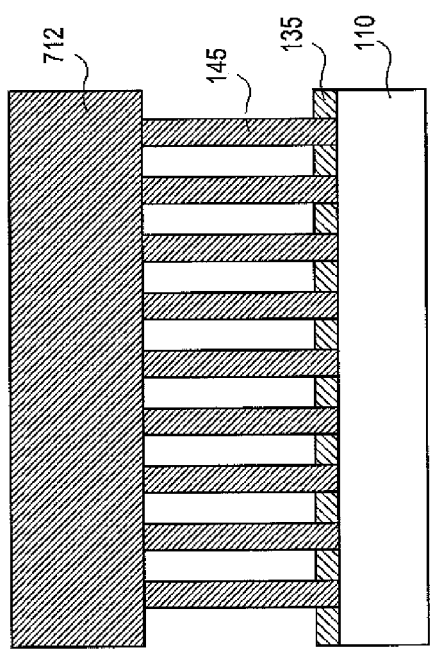
FIG. 7B
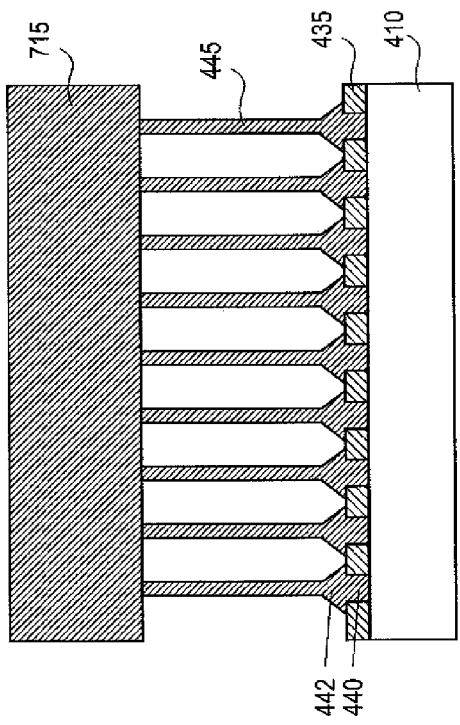
FIG. 7C
FIG. 7D

1400

US 7,968,359 B2

THIN-WALLED STRUCTURES

RELATED APPLICATIONS

This application is a continuation-in-part of U.S. patent application Ser. No. 11/684,264, entitled "Pulsed Growth of GaN Nanowires and Applications in Group III Nitride Semiconductor Substrate Materials and Devices," filed Mar. 9, 2007, now U.S. Pat. No. 7,521,274 which is hereby incorporated by reference in its entirety.

The U.S. patent application Ser. No. 11/684,264 claims priority from U.S. Provisional Patent Application Ser. No. 60/780,833, filed Mar. 10, 2006, Ser. No. 60/798,337, filed May 8, 2006, Ser. No. 60/808,153, filed May 25, 2006, and Ser. No. 60/889,363, filed Feb. 12, 2007, which are hereby incorporated by reference in their entirety.

GOVERNMENT RIGHTS

This invention was made with government support under Contract No. HR0011-05-1-0006 awarded by the Defense Advanced Research Projects Agency/Army Research Office, and Contract No. F49620-03-1-0013 and Contract No. FA9550-06-1-0001 awarded by the Air Force Office of Scientific Research. The government has certain rights in the invention.

FIELD OF THE INVENTION

This invention relates generally to semiconductor materials, devices, and methods for their manufacture and, more particularly, relates to semiconductor thin-walled structures, related devices and methods for their formation.

BACKGROUND OF THE INVENTION

Nanowires composed of group III-N alloys (e.g., GaN) provide the potential for new semiconductor device configurations such as nanoscale optoelectronic devices. For example, GaN nanowires can provide large bandgap, high melting point, and chemical stability that is useful for devices operating in corrosive or high-temperature environments. The larger bandgap of GaN and its related alloys also allows the fabrication of light sources in the visible range that are useful for displays and lighting applications.

The emerging solid-state lighting and UV sensor industries are also in need of high power light emitting devices (LEDs) and lasers. For example, large GaN structures may be required for the fabrication of high power GaN-based LEDs and lasers.

Thus, there is a need to overcome these and other problems of the prior art and to provide high-quality thin-walled structures and related active devices, as well as methods for their manufacturing.

SUMMARY OF THE INVENTION

According to various embodiments, the present teachings include a method of forming a thin-walled structure. The thin-walled structure can be formed by first forming a selective growth mask over a substrate. The selective growth mask can include a plurality of patterned apertures. A semiconductor material can be disposed on the substrate and in each patterned aperture to form the thin-walled structure. As disclosed, at least one lateral dimension of each patterned aperture can be in a small size to allow a threading defect termination at a sidewall of the formed thin-walled structure. The semiconductor material can be continuously grown using a pulsed growth mode until a desired length is reached for the thin-walled structure.

According to various embodiments, the present teachings also include a thin-walled structure. The thin-walled structure can include a selective growth mask disposed over a substrate. The selective growth mask can include a plurality of patterned apertures with each patterned aperture exposing a surface portion of the substrate. The thin-walled structure can be connected to and extended from the surface portion of the substrate and through each patterned aperture, wherein at least one lateral dimension of each patterned aperture can be small enough to allow a threading defect termination at a sidewall of the thin-walled structure.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

FIGS. 7A-7D depict four exemplary variants of semiconductor devices including GaN substrate structures formed from the plurality of nanowires and/or nanowire arrays shown in FIGS. 1-6 in accordance with the present teachings.

DESCRIPTION OF THE EMBODIMENTS

Figure 1A:
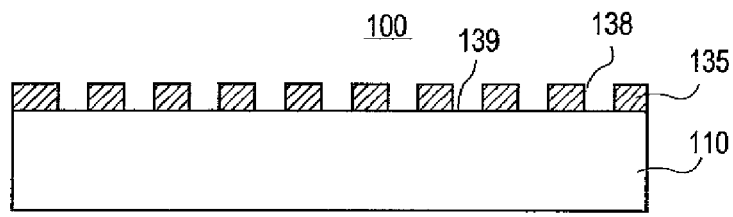
FIGS. 1A-1C depict cross-sectional views of an exemplary semiconductor nanowire device at various stages of fabrication in accordance with the present teachings.

Reference will now be made in detail to exemplary embodiments of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Exemplary embodiments provide semiconductor devices including high-quality (i.e., defect free) group III-N nanowires and uniform group III-N nanowire arrays as well as scalable processes for their manufacturing, where the position, orientation, cross-sectional features, length and/or the crystallinity of each nanowire can be precisely controlled. Specifically, a plurality of nanowires and/or nanowire arrays can be formed using a selective growth mode followed by a growth-mode-transition from the selective growth mode to a pulsed growth mode. The cross-sectional features, for example, the cross-sectional dimensions (e.g., diameter or width), and the cross-sectional shapes, of each nanowire obtained from the selective growth mode can be maintained by continuing the growth using the pulsed growth mode. In this manner, nanowires with a high aspect ratio can be formed. In an exemplary embodiment, the length of each nanowire can be, for example, about 10 nm to about 1000 microns, for example about 10 nm to about 100 microns.

In addition, high-quality group III-N films, for example, high-quality GaN films, can be formed by terminating and coalescing the plurality of nanowires and/or nanowire arrays. These GaN films can be used as GaN substrate structures to facilitate the fabrication of GaN-based devices such as visible LEDs and lasers for the emerging solid-state lighting and UV sensor industries.

Furthermore, because each of the pulsed-grown nanowires and/or nanowire arrays can provide nonpolar sidewalls, there are advantages in using a core-shell growth to build an MQW active shell structure on the sidewalls of each nanowire. Such core-shell nanowire/MQW active structures can be used in nanoscale photoelectronic devices having high efficiencies, such as, for example, nanowire LEDs and/or nanowire lasers.

As used herein, the term "nanowire" generally refers to any elongated conductive or semiconductive material that includes at least one minor dimension, for example, one of the cross-sectional dimensions such as width or diameter, of less than or equal to about 1000 nm. In various embodiments, the minor dimension can be less than about 100 nm. In various other embodiments, the minor dimension can be less than about 10 nm. The nanowires can have an aspect ratio (e.g., length: width and/or major dimension: minor dimension) of about 100 or greater. In various embodiments, the aspect ratio can be about 200 or greater. In various other embodiments, the aspect ratio can be about 2000 or greater. In an exemplary embodiment, the cross-section of the nanowire can be highly asymmetric such that in one direction of the cross-sectional dimension can be much less than 1000 nm and in an orthogonal direction the dimension can be substantially greater than 1000 nm.

It is also intended that the term "nanowires" also encompass other elongated structures of like dimensions including, but not limited to, nanoshafts, nanopillars, nanoneedles, nanorods, and nanotubes (e.g., single wall nanotubes, or multiwall nanotubes), and their various functionalized and derivatized fibril forms, such as nanofibers in the form of thread, yarn, fabrics, etc.

The nanowires can have various cross-sectional shapes, such as, for example, rectangular, polygonal, square, oval, or circular shape. Accordingly, the nanowires can have cylindrical and/or cone-like three dimensional (3-D) shapes. In various embodiments, a plurality of nanowires can be, for example, substantially parallel, arcuate, sinusoidal, etc., with respect to each other.

The nanowires can be formed on/from a support, which can include selected surface regions where the nanowires can be connected to and extend (e.g., be grown) from. The support of the nanowires can also include a substrate formed from a variety of materials including Si, SiC, sapphire, III-V semiconductor compounds such as GaN or GaAs, metals, ceramics or glass. The support of the nanowires can also include a selective growth mask formed on the substrate. In various embodiments, the support of the nanowires can further include a buffer layer disposed between the selective growth mask and the substrate.

In various embodiments, nanowire active devices, for example, nanowire LEDs or nanowire lasers, can be formed using the nanowires and/or nanowire arrays. In various embodiments, the nanowires and/or nanowire arrays and the nanowire active devices can be formed using a III-V compound semiconductor materials system, for example, the group III-N compound materials system. Examples of the group III elements can include Ga, In, or Al, which can be formed from exemplary group III precursors, such as trimethylgallium (TMGa) or triethylgallium (TEGa), trimethylindium (TMIn) or trimethylaluminum (TMAl). Exemplary N precursors can be, for example, ammonia ($NH_3$). Other group V elements can also be used, for example, P or As, with exemplary group V precursors, such as tertiarybutylphoshine (TBP), or arsine ($AsH_3$).

In the following description, group III-N semiconductor alloy compositions can be described by the combination of group III-N elements, such as, for example, GaN, AlN, InN, InGaN, AlGaN, or AlInGaN. Generally, the elements in a composition can be combined with various molar fractions. For example, the semiconductor alloy composition InGaN can stand for $In_xGa_{1-x}N$, where the molar fraction, x, can be any number less than 1.00. In addition, depending on the molar fraction value, various active devices can be made by similar compositions. For example, an $In_{0.3}Ga_{0.7}N$ (where x is about 0.3) can be used in the MQW active region of LEDs for a blue light emission, while an $In_{0.43}Ga_{0.57}N$ (where x is about 0.43) can be used in the MQW active region of LEDs for a green light emission.

In various embodiments, the nanowires, nanowire arrays, and/or the nanowire active devices can include a dopant from a group consisting of: a p-type dopant from Group II of the periodic table, for example, Mg, Zn, Cd and Hg; a p-type dopant from Group IV of the periodic table, for example, C; or an n-type dopant selected from a group consisting of: Si, Ge, Sn, S, Se and Te.

In various embodiments, the nanowires and/or nanowire arrays as well as the nanowire active devices can have high-quality heterogeneous structures and be formed by various crystal growth techniques including, but not limited to, metal-organic chemical vapor deposition (MOCVD) (also known as organometallic vapor phase epitaxy (OMVPE)), molecular-beam epitaxy (MBE), gas source MBE (GSMBE), metal-organic MBE (MOMBE), atomic layer epitaxy (ALE), or hydride vapor phase epitaxy (HVPE).

In various embodiments, a multiple-phase growth mode, for example, a two-phase growth mode, can be used for the high-quality crystal growth of nanowires and/or nanowire arrays as well as nanowire active devices. For example, a first phase growth mode such as a selective growth mode can be used to provide a condition for growth selectivity and nucleation of the nanowires and/or nanowire arrays. In the selective growth mode, standard crystal growth methods, for example, standard MOCVD, can be used to nucleate the growth of the nanowires with a desired thickness of, for example, about 10 nm or more.

The second phase growth mode can create a process to continue the growth of each nanowire and maintain its cross-sectional features from the first growth mode, and also provide an arbitrary desired length. The second phase growth mode can be applied by a growth-mode-transition, which can terminate the first phase growth mode. In the second phase growth mode, a pulsed growth mode, for example, a pulsed MOCVD growth, can be used.

As used herein, the term "pulsed growth mode" refers to a process in which the group III and group V precursor gases are introduced alternately in a crystal growth reactor with a designed sequence. For example, TMGa and $NH_3$ can be used as the precursors for an exemplary formation of GaN nanowires and/or nanowire arrays and/or GaN nanowire active devices. In the pulsed growth mode, TMGa and $NH_3$ can be introduced alternately in a sequence that introduces TMGa with a designed flow rate (e.g., about 10 sccm) for a certain period of time (e.g., about 20 seconds) followed by introducing $NH_3$ with a designed flow rate (e.g., about 1500 sccm) for a time period (e.g., about 30 seconds). In various embodiments, one or more sequence loops can be conducted (e.g., repeated) for a designed length of each nanowire. In various embodiments, the growth rate of each nanowire can be orientation dependent.

In various embodiments, dielectric materials can be involved in formation of the disclosed nanowires, nanowire arrays, and/or nanowire active devices. For example, the selective growth mask can be made of dielectric materials during the formation of the plurality of nanowires and/or nanowire arrays. In another example, dielectric materials can be used for electrical isolation for active devices such as nanowire LEDs and/or nanowire lasers. As used herein, the dielectric materials can include, but are not limited to, silicon dioxide ($SiO_2$), silicon nitride ($Si_3N_4$), silicon oxynitride (SiON), fluorinated silicon dioxide (SiOF), silicon oxycarbide (SiOC), hafnium oxide ($HfO_2$), hafnium-silicate (HfSiO), nitride hafnium-silicate (HfSiON), zirconium oxide ($ZrO_2$), aluminum oxide ($Al_2O_3$), barium strontium titanate (BST), lead zirconate titanate (PZT), zirconium silicate ($ZrSiO_2$), tantalum oxide ($TaO_2$) or other insulating materials. According to various other embodiments, a conducting metal growth mask, such as, for example, tungsten can be used for selective growth of the disclosed nanowires.

Exemplary embodiments for semiconductor devices of nanowires and/or nanowire arrays and their scaleable processes for growth are shown in FIGS. 1A-1C, FIGS. 2-3, FIGS. 4A-4C, FIG. 5, and FIGS. 6A-6D.

Figure 1B:
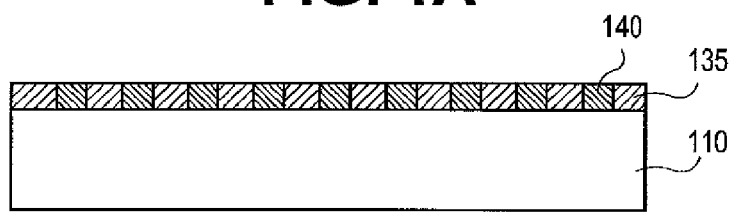
Figure 1C:
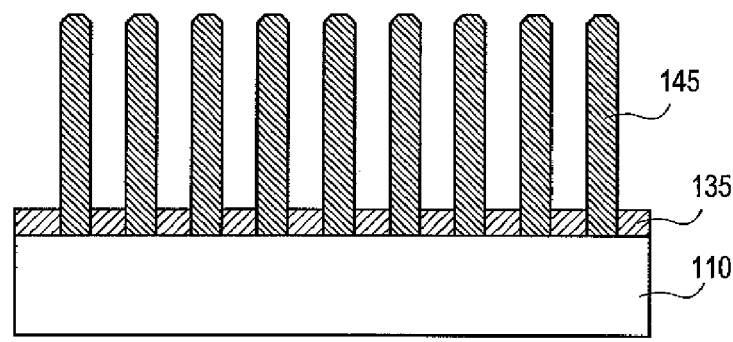

FIGS. 1A-1C depict cross-sectional views of an exemplary semiconductor nanowire device 100 at various stages of fabrication in accordance with the present teachings. It should be readily apparent to one of ordinary skill in the art that the nanowire device 100 depicted in FIGS. 1A-1C represents a generalized schematic illustration and that other layers/nanowires may be added or existing layers/nanowires may be removed or modified.

As shown in FIG. 1A, the nanowire device 100 can include a substrate 110, a selective growth mask 135, and a plurality of patterned apertures 138. The selective growth mask 135 and the plurality of patterned apertures 138 can be disposed over the substrate 110, wherein the plurality of patterned apertures 138 can be interspersed through the selective growth mask 135.

The substrate 110 can be any substrate on which a group III-N material can be grown. In various embodiments, the substrate 110 can include, but is not limited to, sapphire, silicon carbide, silicon, silicon-on-insulator (SIO), III-V semiconductor compounds such as GaN or GaAs, metals, ceramics or glass.

The selective growth mask 135 can be formed by patterning and etching a dielectric layer (not shown) formed over the substrate 110. In various embodiments, the dielectric layer can be made of any dielectric material and formed using techniques known to one of ordinary skill in the art. The dielectric layer can then be patterned using one or more of interferometric lithography (IL) including immersion interferometric lithography and nonlinear interferometric lithography, nanoimprint lithography (NL), and e-beam lithography, which can produce nanostructures or patterns of nanostructures over wide and macroscopic areas. After the patterning, an etching process, for example, a reactive ion etching, can be used to form the plurality of patterned apertures 138. The etching process can be stopped at the surface of the underlying layer, i.e., the substrate 110, and exposing a plurality of surface portions 139 of the substrate 110. In various embodiments, the selective growth mask 135 can be a conducting metal growth mask made of, for example, tungsten, to provide selective growth as desired for pulsed nanowire growth.

The plurality of patterned apertures 138 can have a thickness the same as the selective growth mask 135, for example, about 30 nm or less, and a cross-sectional dimension, such as a diameter, of about 10 nm to about 1000 nm. As an additional example, the diameter can be about 10 to about 100 nm. In an exemplary embodiment, the plurality of patterned apertures 138 can have a hexagonal array with a pitch (i.e., center-to-center spacing between any two adjacent patterned apertures) ranging from about 50 nm to about 10 μm. In various embodiments, arrays of the plurality of patterned apertures 138 can be formed. Thereafter, the nanoscale features of the plurality of the patterned apertures 138 can be transferred to the subsequent processes for the formation of nanowires and/or nanowire arrays.

In various embodiments, various cleaning procedures can be conducted on the device 100 shown in FIG. 1A prior to the subsequent growth of the nanowires and/or nanowire arrays. For example, the cleaning processes can include an ex-situ cleaning (i.e., the cleaning is conducted outside the growth reactor) followed by an in-situ cleaning (i.e., the cleaning is conducted within the growth reactor). Depending on materials used for the selective growth mask 135, various cleaning methods can be used. In an exemplary embodiment, a silicon nitride selective growth mask can be cleaned by a standard ex-situ cleaning followed by an in-situ cleaning by loading the device 100 into an exemplary MOCVD reactor and heating the device 100 to about 950° C. for approximately 3 minutes under flowing hydrogen. This hydrogen-reducing-atmosphere can remove undesirable native oxides on the surfaces of the device 100. Depending on the material combination of the substrate 110 and selective growth mask 135, one of ordinary skill in the art will understand that alternative cleaning procedures can be used.

In FIG. 1B, a plurality of nanostructure nuclei 140 can be selectively grown from the exposed plurality of surface portions 139 of the substrate 110 to fill each of the plurality of patterned apertures 138, which can be defined by the selective growth mask 135. The selective growth mask 135 can serve as a selective growth mold to negatively replicate its nanopatterns from the plurality of patterned apertures 138 to the plurality of nanostructure nuclei 140. In this manner, the position and the cross-sectional features, such as the shape and dimensions, of each of the plurality of nanostructure nuclei 140 can be determined by that of each patterned aperture of the plurality of patterned apertures 138. For example, the plurality of patterned apertures 138 can include a hexagonal array with a dimension of about 250 nm. The hexagonal array can then be transferred to the growth of the plurality of nanostructure nuclei 140 with a similar or smaller dimension of about 250 nm or less. In another example, if the one or more apertures of the plurality of patterned apertures 138 are approximately circular with an exemplary diameter of about 100 nm, one or more nuclei of the plurality of nanostructure nuclei 140 can be grown in the circular apertures with a similar diameter of about 100 nm or less. Thus, the plurality of nanostructure nuclei 140 can be positioned in a well-defined location and shaped correspondingly to the plurality of the patterned apertures 138 defined by the selective growth mask 135. In various embodiments, the plurality of nanostructure nuclei 140 can be formed by, for example, a standard MOCVD process.

In this manner, the device 100 shown in FIG. 1B can be used as a support for nanowires and/or nanowire arrays, which can include a plurality of selected surface regions (i.e., each surface of the plurality of nanostructure nuclei 140). A plurality of nanowires and/or nanowire arrays can then be grown from the plurality of selected surface regions. In various embodiments, the selective growth mask 135 can be removed by a suitable etching process to expose the plurality of nanostructure nuclei 140 after the formation of the plurality of the nanowires.

In FIG. 1C, a plurality of nanowires 145 can be formed by continuing the growth of the plurality of nanostructure nuclei 140 by, for example, terminating the selective growth mode and applying a pulsed growth mode, before the plurality of nanostructure nuclei 140 protrudes from a top of the selective growth mask 135. The plurality of nanowires 145 can be formed of the same material of the nanostructure nuclei 140, for example, GaN, AlN, InN, InGaN, AlInGaN, or AlGaN. In various embodiments, heterostructures can be formed form each of the plurality of nanowires 145. In various embodiments, n-type and/or p-type dopants can be incorporated into the plurality of nanowires 145 depending on the desired application.

By transitioning to the pulsed growth mode before growth of the plurality of nanostructure nuclei 140 protrudes from the top of the selective growth mask 135, features such as cross-sectional shape and dimensions of each of the plurality of nanowires 145 can be preserved until a desired length is reached. In other words, the cross-sectional features of the nanowires 145, such as shape and/or dimension, can remain substantially constant, the same or similar as that of the apertures 138. In various embodiments, the length of each nanowire can be on an order of micrometers, for example, about 20 μm or more.

Figure 2:
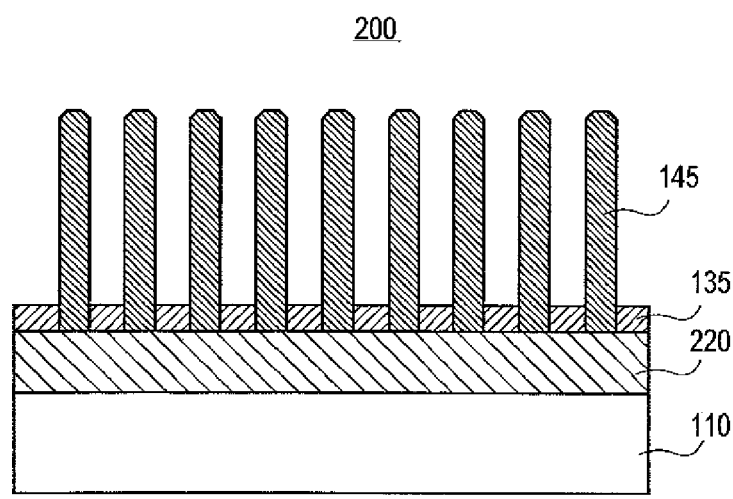
FIG. 2 depicts a second exemplary semiconductor nanowire device in accordance with the present teachings.

In various embodiments, a buffer layer can be formed in the nanowire devices. FIG. 2 depicts a second exemplary semiconductor nanowire device 200 including a buffer layer in accordance with the present teachings. As shown, the nanowire device 200 can include a buffer layer 220 disposed between a substrate such as the substrate 110 and a selective growth mask such as the selective growth mask 135 (see FIGS. 1A-1C). In various embodiments, the buffer layer 220 can be a planar semiconductor film formed of, for example, GaN, AlN, InN, InGaN, AlInGaN or AlGaN, by, for example, standard MOCVD. In various embodiments, the thickness of the buffer layer 220 can be, for example, about 100 nm to about 10 μm. In various embodiments, the buffer layer 220 can be doped with either an n-type or a p-type dopant in order to provide an electrical connection to the lower end of each nanowire of the plurality of nanowires 140. Various dopants known to one of ordinary skill in the art can be used.

In various embodiments, the orientation of the plurality of nanostructure nuclei 140 can be controlled along a single direction, which can in turn be controlled by intentionally orienting the plurality of patterned apertures 138 along the single crystal direction. For example, the plurality of patterned apertures 138 can be intentionally oriented along a single direction of the buffer layer 220 as shown in FIG. 2. In an exemplary embodiment during IL patterning, the apertures in the selective growth mask 135 can be intentionally oriented along the <1$\bar{1}$00> direction of a GaN buffer layer. In another exemplary embodiment when the GaN buffer layer is grown on a sapphire substrate, there can be a 30° rotation about the c axis between the GaN buffer layer and the sapphire unit cells.

Figure 3:
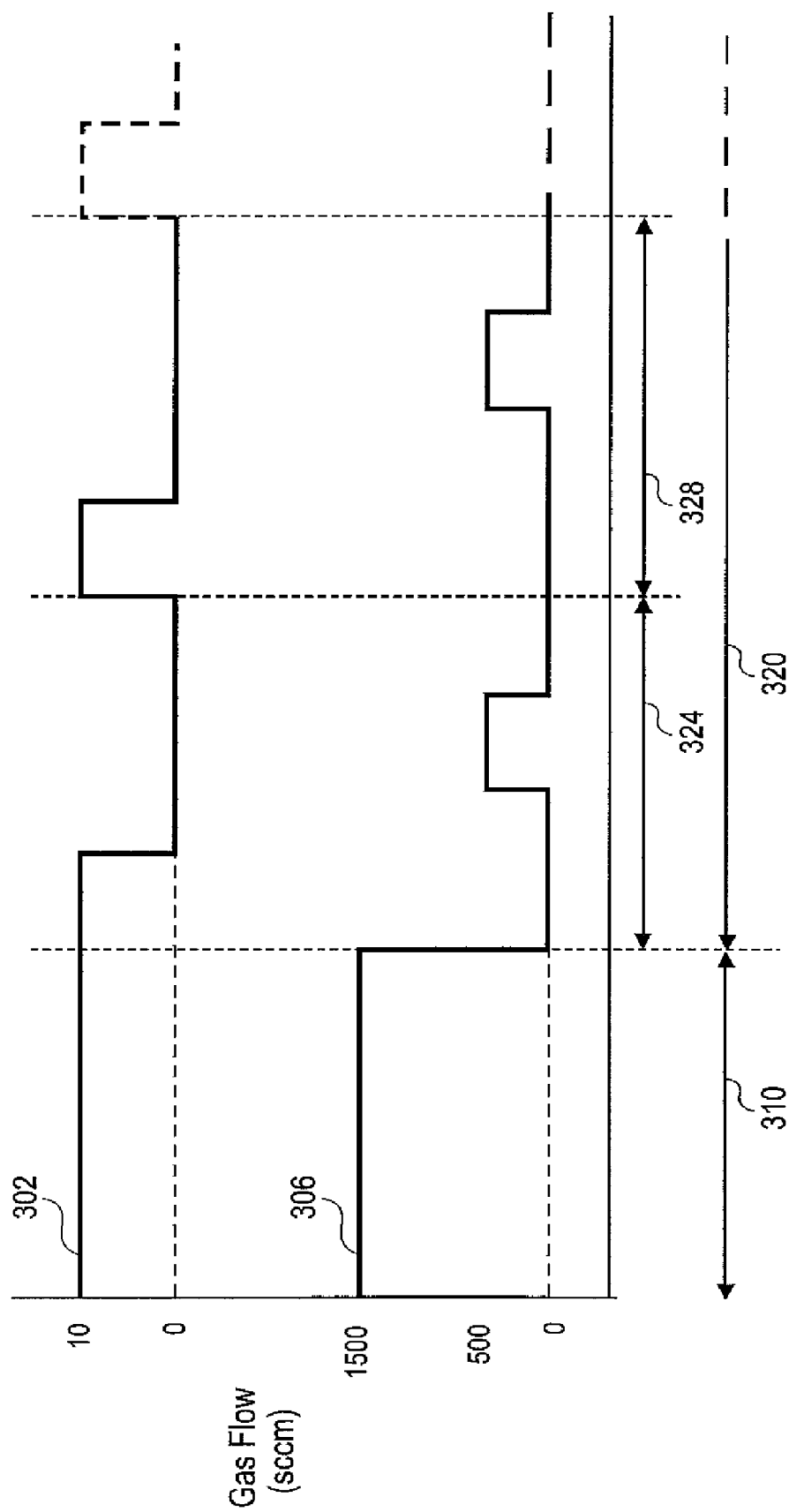
FIG. 3 depicts an exemplary process for forming a plurality of nanowires and/or nanowire arrays using a two-phase growth mode in accordance with the present teachings.

FIG. 3 depicts an exemplary process for forming a plurality of nanowires and/or nanowire arrays using the two-phase growth mode in accordance with the present teachings. Specifically, FIG. 3 illustrates precursor gas flow curves (including a first gas flow curve 302 and a second gas flow curve 306) during a selective growth 310 and a subsequent pulsed growth 320 for the formation of, for example, the plurality of nanowires 145 as described in FIGS. 1-2. As shown, the selective growth 310 can be terminated by starting a pulsed growth 320 (i.e., growth-mode-transition) at a transition time $t_1$. The pulsed growth 320 can further include a number of pulsed sequences, for example, a first sequence loop 324, a second sequence loop 328 and/or additional sequence loops. In various embodiments, the first sequence loop 324 can be repeated as the second sequence loop 328.

In an exemplary embodiment for the formation of GaN nanowires and/or nanowire arrays, the first gas flow curve 302 can be plotted for a first precursor gas such as trimethylgallium (TMGa), and the second gas flow curve 306 can be plotted for a second precursor gas such as ammonia ($NH_3$). During the selective growth 310, the exemplary GaN nanowires and/or nanowire arrays can be formed in a MOCVD reactor including the first precursor gas TMGa with a constant flow rate of about 10 sccm, and the second precursor gas $NH_3$ with a constant flow rate of about 1500 sccm. That means, during the selective growth 310, the precursor gases (i.e., TMGa and $NH_3$) can be flowed continuously, not pulsed (i.e., both Group III and Group V precursor gases are provided to the substrate together in a continuous, non-pulsed growth mode). Moreover, the group V precursor gas (e.g., TMGa) and group III precursor gas (e.g. $NH_3$) can be introduced simultaneously and the group V/group III ratio can be maintained, for example, at about 100 to about 500. In an exemplary embodiment, the group V/group III ratio can be maintained at about 150. Further, other reactor conditions for the selective growth 310 can include, for example, an initial reaction temperature of about 1015° C. to about 1060° C., a reactor pressure of about 100 Torr, and a hydrogen/nitrogen carrier gas mixture having a laminar flow of about 4000 sccm. Any suitable MOCVD reactor may be used, such as the Veeco TurboDisk model P75 MOCVD reactor in which the substrates are rotated at a high speed during deposition.

During pulsed growth 320, the first precursor gas such as TMGa and the second precursor gas such as $NH_3$ can be introduced alternately into the growth reactor in a designed sequence, for example, shown as the first sequence loop 324. In various embodiments, the duration of each alternating step within the pulsed sequence can affect the growth of the nanowires and/or nanowire arrays, which can further be optimized for specific reactor geometries. For example, in the first pulsed sequence loop 324, TMGa can be introduced with a flow rate of about 10 sccm for a certain period of time such as about 20 seconds (not illustrated) followed by, for example, a 10 second carrier-gas purge (e.g., a mixture of hydrogen/nitrogen) during which no precursor gases are introduced, and followed by introducing $NH_3$ with a flow rate of about 1500 sccm for a time period such as about 30 seconds (not illustrated) followed by, for example, a 10 second carrier-gas purge (e.g., a mixture of hydrogen/nitrogen) with no precursor gases involved. Other pulse durations may also be used depending on the reactor configurations, such as for example 15-40 seconds for the Group III reactant, 15-40 seconds for the Group V reactant and 5-15 seconds for the purge gases between each reactant introduction step. In various embodiments, the pulsed sequence such as the first sequence loop 324 can be repeated until a certain length of the GaN nanowires is reached. For example, the sequence loop 324 can be repeated as the second sequence loop 328, the third sequence loop (not illustrated) and so on. In each sequence loop, the group V precursor gas (e.g., TMGa) and group III precursor gas (e.g. $NH_3$) can have an effective V/III ratio in a range of, for example, from about 60 to about 300. In various embodiments, the temperature, reactor pressure, and carrier gas flow for the pulsed growth 320 can remain at their same settings as for the selective growth 310. One of ordinary skill in the art will understand that the disclosed growth parameters are exemplary and can vary depending on the specific reactor used.

In various embodiments, the transition time ($t_1$) can be determined by the duration of the selective growth 310. The transition time ($t_1$) can be dependent on the growth rate inside each aperture, for example, each of the plurality of patterned apertures 138 shown in FIGS. 1-2. The growth rate inside each aperture can in turn depend on the gas flows (e.g., shown as gas flow curves 302 and 304) of each precursor gas and the geometry of each aperture of the plurality of patterned apertures 138. This geometrical dependence can occur because the growth nutrients, for example, from TMGa and/or $NH_3$, can be deposited both on the selective growth mask and in the open apertures. During selective growth 310, the nutrient that deposits on the selective growth mask can have a high surface mobility and can either leave the mask surface or, if it is close enough to an open aperture, diffuse to that aperture and contribute to the growth rate in that aperture. This additional growth rate contribution can therefore vary based on the size of the apertures and the distance between the apertures. In an exemplary embodiment for forming a plurality of GaN nanowires and/or nanowire arrays, the growth-mode-transition can occur after a 1 minute duration of the selective growth (i.e., $t_1$=1 minute), which can be experimentally determined by the GaN growth rate inside the patterned apertures. For example, the GaN growth rate can be about 0.6 µm/hr and the patterned apertures can be in the form of a hexagonal array having a diameter of about 200 nm and a pitch of about 1 µm.

In various embodiments, the growth of the plurality of nanowires and/or nanowire arrays can be affected by when the growth-mode-transition is applied. For example, the growth-mode-transition can be applied after growth of the plurality of nanostructure nuclei 140 protrude over the top of the selective growth mask (such as 135 seen in FIGS. 1-2). In various embodiments, different configurations/dimensions can be obtained for the nanowires and/or nanowire arrays, depending on whether the growth-mode-transition is applied "before" (e.g., as shown in FIGS. 1-2) or "after" the nanowire nuclei have grown to protrude over the top of the selective growth mask.

Figure 4A:
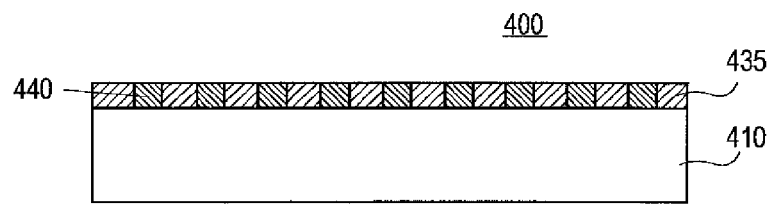
FIGS. 4A-4C depict a third exemplary semiconductor nanowire device in accordance with the present teachings.
Figure 4B:
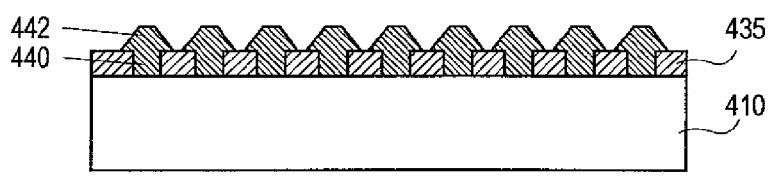
Figure 4C:
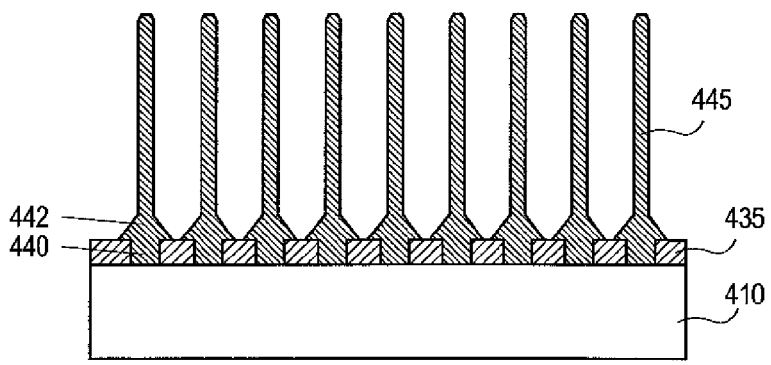

FIGS. 4A-4C depict a third exemplary semiconductor nanowire device 400 formed by having a growth-mode-transition "after" the nanowire nuclei have grown to protrude over the top of the selective growth mask. It should be readily apparent to one of ordinary skill in the art that the nanowire device 400 depicted in FIGS. 4A-4C represents a generalized schematic illustration and that other layers/nanowires can be added or existing layers/nanowires can be removed or modified.

In FIG. 4A, the device 400 can include a similar structure and be formed by a similar fabrication process as described in FIG. 1C for the device 100. As shown, the device 400 can include a substrate 410, a selective growth mask 435 and a plurality of nanostructure nuclei 440. The selective growth mask 435 and the plurality of nanostructure nuclei 440 can be formed over the substrate 410, wherein the plurality of nanostructure nuclei 440 can be interspersed through the selective growth mask 435.

The substrate 410 can be any substrate similar to the substrate 110 of the device 100, on which a group III-N material can be grown. The substrate 410 can be, for example, sapphire, silicon carbide, or silicon. Likewise, the plurality of nanostructure nuclei 440 can be formed similarly to that of the plurality of nanostructure nuclei 440 of the device 100 shown in FIG. 1B. For example, the plurality of nanostructure nuclei 440 can be formed by first forming a plurality of patterned apertures (not shown) defined by the selective growth mask 435 over the substrate 410. Each of the plurality of patterned apertures can then be filled by growing a semiconductor material (e.g., GaN) therein using, for example, standard MOCVD. The plurality of nanostructure nuclei 440 can have a thickness of the selective growth mask 435, for example, about 30 nm, and a cross-sectional dimension, such as a width or a diameter, of, for example, about 10 nm to about 200 nm. And as an additional example, the width or diameter of the cross-sectional dimension can be about 10 nm to about 100 nm.

In FIG. 4B, the device 400 can include a plurality of nanostructures 442 grown laterally as well as vertically from the plurality of nanostructure nuclei 440, when the growth-mode-transition occurs "after" the plurality of nanostructure nuclei 440 protrudes over the top of the selective growth mask 435. For example, each of the plurality of nanostructures 442 can be grown laterally, spreading sideways, and partially on the surface of the selective growth mask 435. In various embodiments, the plurality of nanostructures 442 can include a pyramid-shaped structure providing a top crystal facet. For example, a plurality of GaN pyramid-shaped nanostructures can include a (0001) top facet and the dimensions of this top facet can be controlled by the extent of the growth of each nanostructure. Specifically, at the early stage of the growth, when the plurality of nanostructures 442 is growing laterally and partially on the surface of the selective growth mask 435, the top facet dimensions can be increased and be broader than the cross-sectional dimensions of the plurality of nanostructure nuclei 440. When the growth is continued, the top facet dimensions can be decreased such that a point of the top facet dimensions can be smaller than that of the plurality of nanostructure nuclei 440. Therefore, the dimensions of each pyramid top facet can be controlled by, for example, a termination of the selective growth mode (i.e., to apply the growth-mode-transition) to stop the growth of the plurality of pyramid-shaped nanostructures. In various embodiments, the exemplary pyramid-shaped top facets can be truncated and the dimension of each truncated top facet can then be maintained for the subsequent growth of the nanowires and/or nanowire arrays using the pulsed growth mode. In various embodiments, the truncated top facet diameter of each of the plurality of nanostructures 442 can be controlled to be smaller than that of each of the plurality of the nanostructure nuclei 440. In various embodiments, the top facet of each of the plurality of nanostructures 442 can have an exemplary cross-sectional shape of, for example, a square, a polygon, a rectangle, an oval, and a circle.

The device 400 shown in FIG. 4B can be used as a support of nanowires and/or nanowire arrays, which can also include a plurality of selected surface regions (i.e., the surface of each top facet of the plurality of nanostructures 442). A plurality of nanowires and/or nanowire arrays can then be grown from the plurality of selected surface regions and maintain the cross-sectional features (e.g., dimensions and shapes) of each of the plurality of selected surface regions.

In FIG. 4C, a plurality of nanowires 445 can be formed by continuing the growth of the semiconductor material (e.g., GaN) from the plurality of selected surface regions of the device 400 (i.e., from each top facet of the plurality of nanostructures 442) using the pulsed growth mode. As a result, the plurality of nanowires 445 can be regularly spaced and have an exemplary diameter ranging from about 20 to about 500 nm, and an exemplary cross-sectional shape of, for example, a square, a polygon, a rectangle, an oval, and a circle.

By using the pulsed growth mode "after" the semiconductor material is grown to protrude over the top of the selective growth mask 435, the plurality of nanowires 445 can be formed on the top facets of the exemplary pyramid-shaped structures of the plurality of nanostructures 442. Features such as cross-sectional shapes and dimensions of each of the plurality of nanowires 445 can remain constant with that of the truncated top facets until a desired length is reached. In various embodiments, the length of each nanowire can be controlled on an order of micrometers, such as, for example, about 20 μm or higher.

Figure 5:
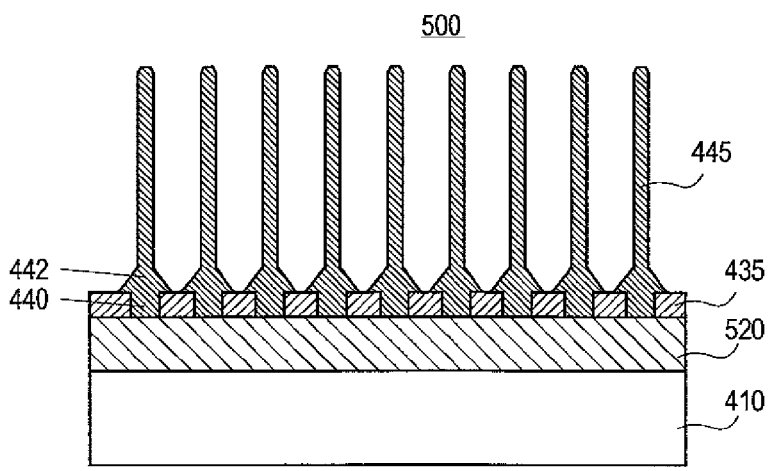
FIG. 5 depicts a forth exemplary semiconductor nanowire device in accordance with the present teachings.

FIG. 5 depicts another exemplary semiconductor nanowire device 500 including a buffer layer in accordance with the present teachings. As shown, the nanowire device 500 can include a buffer layer 520 disposed between a substrate, such as the substrate 410, and a selective growth mask, such as the selective growth mask 435. The buffer layer 520 can be a similar layer to the buffer layer 220 shown in FIG. 2. The buffer layer 520 can be a planar film formed of, for example, GaN, AlN, InN or AlGaN, using, for example, standard MOCVD. In various embodiments, the thickness of the buffer layer 520 can be about 100 nm to about 10 μm. In various embodiments, the buffer layer 520 can be doped with either an n-type or a p-type dopant in order to provide an electrical connection to the lower end of each nanowire.

FIGS. 6A-6D depict exemplary results for a plurality of ordered GaN nanowires and/or nanowire arrays grown by the multiple-phase growth mode without use of a catalyst in accordance with the present teachings (both the nanostructure nuclei 140, 440 and the nanowires 145, 445 are grown without the use of a metal catalyst deposited on the substrate). As shown in FIGS. 6A-6D, the plurality of GaN nanowires 610 can grow with large scale uniformity of position, orientation, length, cross-sectional features (e.g., the dimensions and/or shapes), and crystallinity. As described herein, in some embodiments, the position and dimensions of each nanowire can correspond with that of each aperture of the plurality of patterned apertures 138 shown in FIGS. 1-2. In other embodiments, the position and dimensions of each nanowire can correspond with that of each top facet of the plurality of nanostructures 442 shown in FIGS. 4-5.

Figure 6A:
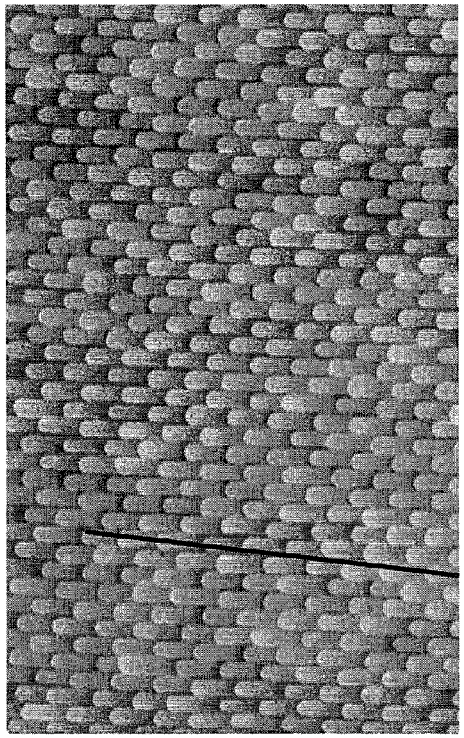
FIGS. 6A-6D depict exemplary results for a plurality of ordered GaN nanowire arrays grown by the two-phase growth mode without use of a catalyst in accordance with the present teachings.
Figure 6B:
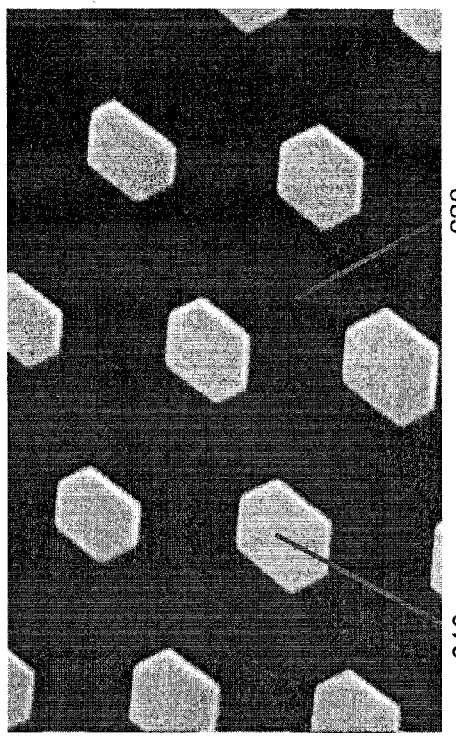

FIG. 6A shows a close-up scanning electron micrograph (SEM) result for the exemplary GaN nanowires 610, while FIG. 6B shows a SEM result with long-range order for the GaN nanowires 610. In various embodiments, each GaN nanowire can have a single crystal nature.

Figure 6C:
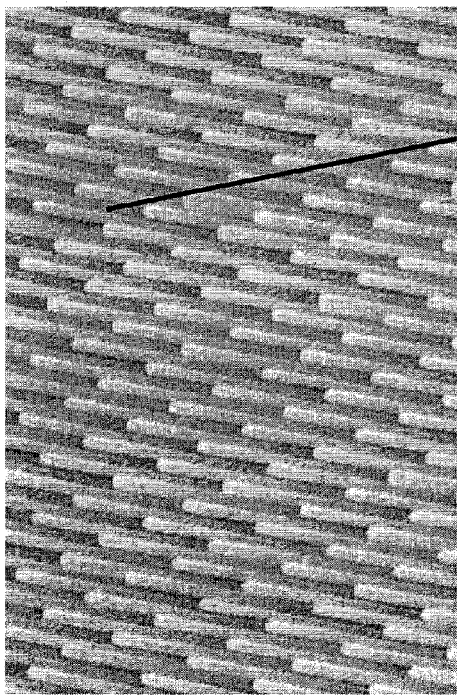

FIG. 6C shows that the orientation of the GaN nanowires 610 can be along a single crystal direction, for example, along the (0001) crystallographic direction of the exemplary GaN nanowires 610. Additionally, the small central (0001) top facet of each nanowire can be bounded by inclined {1$\bar{1}$02} facets on top of each nanowire.

Figure 6D:
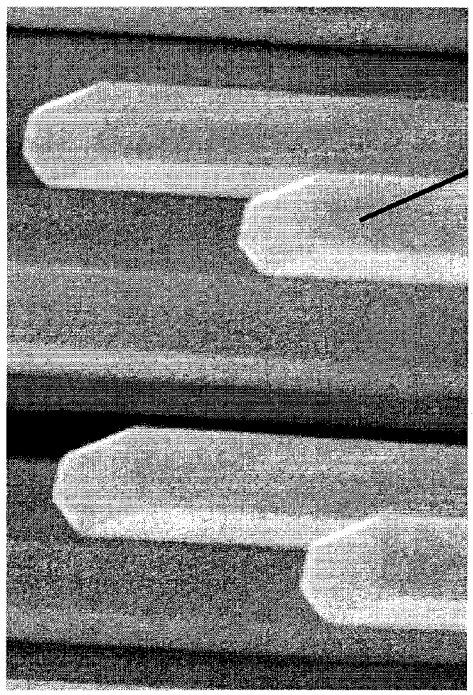

FIG. 6D is a plan view of the exemplary GaN nanowires 610 showing the hexagonal symmetry of the sidewall facets of each GaN nanowire. The sidewall facets can be perpendicular to the direction of the selective growth mask 620 having the sidewall facets of the $\{1\bar{1}00\}$ family. In various embodiments, the diameter of the exemplary GaN nanowires 610 can be about 1000 nm or less.

The invariance of the lateral nanowire geometry (e.g., the cross-sectional features) shown in FIGS. 6A-6D indicates that the GaN growth rate can only occur in the vertical direction, that is, on the (0001) and $\{1\bar{1}02\}$ top facets. For example, the vertical growth rates for the plurality of GaN nanowires 610 of the pulsed growth can be, for example, about 2 µm/hr or higher. On the other hand, the GaN growth rate on the $\{1\bar{1}00\}$ sidewall facets (i.e., lateral direction) can be essential negligible in spite of their much larger area. In an exemplary embodiment, the GaN nanowires 610 can be grown having a uniform length of about 20 µm or higher and maintain a uniform diameter of about 250 nm or less, when a 30-nm-selective-growth-mask is used. In various embodiments, the presence of hydrogen in the carrier gas mixture can be used to control the nanowire geometry.

In addition, the exemplary uniform GaN nanowires 610 shown in FIGS. 6A-6D can be of high-quality, that is, with essentially no threading dislocations (TD). For example, there can be no threading dislocations observed with the GaN nanowires 145 and/or 445 shown in FIG. 2 and FIG. 5, even if the threading dislocations can be observed in the GaN buffer layer 220 and/or 520 underlying the selective growth mask 135 and/or 435, since it is believed that these dislocations bend away from the nanowires and terminate at a surface beneath the growth mask. Furthermore, the defect-free GaN nanowires 610 can be grown on various substrates, such as, for example, sapphire, silicon carbide such as 6H—SiC, or silicon such as Si (111).

In various embodiments, the uniform and high-quality GaN nanowires and/or nanowire arrays can be used for fabrication of high-quality GaN substrate structures. Commercially viable GaN substrates are desired because GaN substrates can greatly facilitate the fabrication of visible LEDs and lasers for the emerging solid-state lighting and UV sensor industries. Moreover, GaN substrates can also be used in other related applications, such as hi-power RF circuits and devices.

In various embodiments, GaN substrate structures can be formed by terminating and coalescing the plurality of GaN nanowires such as those described in FIGS. 1-6 using techniques such as nanoheteroepitaxy. FIGS. 7A-7D depict four exemplary semiconductor devices including GaN substrate structures 712, 714, 715, and 717 formed from the plurality of GaN nanowires of the device 100 (see FIG. 1C), the device 200 (see FIG. 2), the device 400 (see FIG. 4C), and the device 500 (see FIG. 5), respectively.

For example, the GaN growth conditions can be modified to allow coalescence of the formed plurality of nanowires (e.g., 145 or 445) after they have grown to a suitable height, and then formation of a GaN substrate structure (e.g., the substrate 712, 714, 715, or 717). The GaN substrate structure can be a continuous, epitaxial, and fully coalesced planar film. The "suitable height" can be determined for each nanowire (e.g., GaN) and substrate (e.g., SiC or Si) combination and can be a height that allows a significant reduction in defect density in the upper coalesced GaN film (i.e., the GaN substrate structure). In addition, the "suitable height" can be a height that can maintain a mechanically-robust structure for the resulting semiconductor devices, for example, those shown in FIGS. 7A-7D. In various embodiments, because threading defects are not present in the plurality of GaN nanowires (e.g., 145 or 445), the coalescence of the GaN substrate structure (e.g., the substrate 712, 714, 715, or 717) on top of these pluralities of nanowires can then occur and provide the GaN substrate structure containing an extremely low defect density, such as, for example, about $10^7$ cm$^{-2}$ or lower.

According to various embodiments of the nanowire formation process, the process steps, (e.g., the deposition, patterning and etching of the selective growth mask, the selective growth of nanowire nuclei, the pulsed growth of nanowires, and the formation of the exemplary GaN substrate structures) can be scaleable to large substrate areas. They can also be readily extended to manufacturing requirements including automatic wafer handling and extended to larger size wafers for establishing efficacy of photonic crystals for light extraction from visible and near-UV LEDs.

FIGS. 8-12 depict exemplary embodiments for nanowire active devices including nanowire LEDs and nanowire lasers, and their scalable processes for manufacturing. In various embodiments, the disclosed group III-N nanowires and nanowire arrays such as GaN nanowires and/or nanowire arrays can provide their active devices with unique properties. This is because each pulsed-grown GaN nanowire can have sidewalls of $\{1\bar{1}00\}$ family and the normal to each of these side planes can be a nonpolar direction for group III-N materials. High-quality quantum group III-N wells such as quantum InGaN/GaN wells, quantum AlGaN/GaN wells or other quantum III-N wells, can therefore be formed on these side facets of each GaN nanowire.

For example, the nanowire growth behavior can be changed significantly when other precursor gases such as trimethylaluminum (Al) or trimethylindium (In) are added to the exemplary MOCVD gas phase during the pulsed growth mode. In this case, even a small molecular fraction (e.g., about 1%) of Al or In added to the GaN nanowires and/or nanowire arrays can result in each GaN nanowire growing laterally with its cross-sectional dimensions (e.g., width or diameter) increasing over time. This lateral growth behavior can allow creation of a core-shell heterostructure, that is, quantum wells including exemplary materials of such as InGaN and AlGaN alloys can be grown on and envelop each GaN nanowire core. As a result, the core-shell growth can create a core-shell nanowire/MQW active structure for light emitting devices.

In various embodiments, an additional third growth condition can be established to grow the core-shell of the exemplary InGaN and AlGaN alloys, after the GaN nanowire has been grown using the disclosed two-phase growth mode. This third growth mode can be a continuous growth similar to that used in the selective growth mode, for example, as shown at 310 in FIG. 3. In various other embodiments, a pulsed growth mode can be used for the third growth condition.

In various embodiments, the core-shell nanowire/MQW active structure can be used to provide high efficiency nanoscale optoelectronic devices, such as, for example, nanowire LEDs and/or nanowire lasers. For example, the resulting core-shell nanowire/MQW active structure (i.e., having the MQW active shell on sidewalls of each nanowire core) can be free from piezoelectric fields, and also free from the associated quantum-confined Stark effect (QCSE) because each nanowire core has non-polar sidewalls. The elimination of the QCSE can increase the radiative recombination efficiency in the active region to improve the performance of the LEDs and lasers. Additionally, the absence of QCSE can allow wider quantum wells to be used, which can improve the overlap integral and cavity gain of the nanowire based lasers. A further exemplary efficiency benefit of using the core-shell nanowire/MQW active structure is that the active region area can be significant increased because of the unique core-shell structure.

Figure 8:
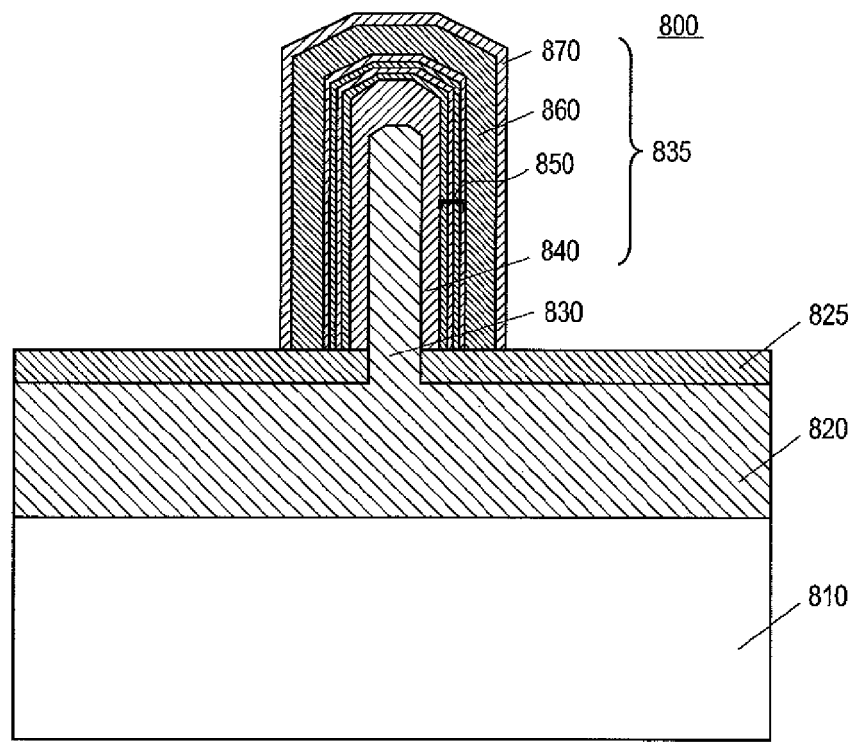
FIG. 8 depicts an exemplary core-shell nanowire/MQW (multiple quantum well) active structure device in accordance with the present teachings.

FIG. 8 depicts a cross-sectional layered structure of an exemplary core-shell nanowire/MQW active structure device 800 in accordance with the present teachings. It should be readily apparent to one of ordinary skill in the art that the device 800 depicted in FIG. 8 represents a generalized schematic illustration and that other materials/layers/shells can be added or existing materials/layers/shells can be removed or modified.

As shown, the device 800 can include a substrate 810, a doped buffer layer 820, a selective growth mask 825, a doped nanowire core 830, and a shell structure 835 including a first doped shell 840, a MQW shell structure 850, a second doped shell 860, and a third doped shell 870.

The selective growth mask 825 can be formed over the doped buffer layer 820 over the substrate 810. The doped nanowire core 830 can be connected to and extend from the doped buffer layer 820 through the selective growth mask 825, wherein the doped nanowire core 830 can be isolated by the selective growth mask 825. The shell structure 835 can be formed to "shell" the doped nanowire core 830 having a core-shell active structure, and the shell structure 835 can also be situated on the selective growth mask 825. In addition, the shell structure 835 can be formed by depositing the third doped shell 870 over the second doped shell 860, which can be formed over the MQW shell structure 850 over a first doped shell 840.

The substrate 810 can be a substrate similar to the substrates 110 and 410 (see FIGS. 1-2 and FIGS. 4-5) including, but not limited to, sapphire, silicon carbide, silicon and III-V substrates such as GaAs, or GaN.

The doped buffer layer 820 can be formed over the substrate 810. The doped buffer layer 820 can be similar to the buffer layers 220 and/or 520 (see FIG. 2 and FIG. 5). The doped buffer layer 820 can be formed of, for example, GaN, AlN, InN, AlGaN, InGaN or AlInGaN, by various crystal growth methods known to one of ordinary skill in the art. In various embodiments, the doped buffer layer 820 can be doped with a conductivity type similar to the doped nanowire core 830. In some embodiments, the doped buffer layer 820 can be removed from the device 800.

The selective growth mask 825 can be a selective growth mask similar to the selective growth masks 135 and/or 435 (see FIGS. 1-2 and FIGS. 4-5) formed on the buffer layer 820. In various embodiments, the selective growth mask 825 can be formed directly on the substrate 810. The selective growth mask 825 can define the selective growth of the plurality of nanowires and/or nanowire arrays. The selective growth mask 825 can be formed of any dielectric material, or other growth mask material known to one of ordinary skill in the art.

The doped nanowire core 830 can use any nanowire of the plurality of nanowires shown in FIGS. 1-2 and FIGS. 4-7 formed using the two-phase growth mode. The doped nanowire core 830 can be formed of, for example, GaN, AlN, InN, AlGaN, InGaN or AlInGaN, which can be made an n-type by doping with various impurities such as silicon, germanium, selenium, sulfur and tellurium. In various embodiments, the doped nanowire core 830 can be made p-type by introducing beryllium, strontium, barium, zinc, or magnesium. Other dopants known to one of ordinary skill in the art can be used. In various embodiments, the height of the doped nanowire core 830 can define the approximate height of the active structure device 800. For example, the doped nanowire core 830 can have a height of about 1 μm to about 1000 μm.

The doped nanowire core 830 can have non-polar sidewall facets of $\{1\bar{1}00\}$ family (i.e., "m"-plane facets), when the material GaN is used for the doped nanowire core 830. The shell structure 835 including the MQW shell structure 850 can be grown by core-shell growth on these facets and the device 800 can therefore be free from piezoelectric fields, and free from the associated quantum-confined Stark effect (QCSE).

The first doped shell 840 can be formed from and coated on the non-polar sidewall facets of the doped nanowire core 830 by an exemplary core-shell growth, when the pulsed growth mode is used. For example, the first doped shell 840 can be formed by adding a small amount of Al during the pulsed growth of the doped nanowire core 830 forming a core-shell heterostructure. The conductivity type of the first doped shell 840 and the doped nanowire core 830 can be made similar, for example, n-type. In various embodiments, the first doped shell 840 can include a material of $Al_xGa_{1-x}N$, where x can be any number less than 1.00 such as 0.05 or 0.10.

The MQW shell structure 850 can be formed on the first doped shell 840 by the exemplary core-shell growth, when the pulsed growth mode is used. Specifically, the MQW shell structure 850 can be formed by adding a small amount of Al and/or In during the pulsed growth of the first doped shell 840 to continue the formation of the core-shell heterostructure. In various embodiments, the MQW shell structure 850 can include, for example, alternating layers of $Al_xGa_{1-x}N$ and GaN where x can be, for example, 0.05 or any other number less than 1.00. The MQW shell structure 850 can also include alternating layers of, for example, $In_xGa_{1-x}N$ and GaN, where x can be any number less than 1.00, for example, any number in a range from about 0.20 to about 0.45.

The second doped shell 860 can be formed on the MQW shell structure 850. The second doped shell 860 can be used as a barrier layer for the MQW shell structure 850 with a sufficient thickness of, such as, for example, about 500 nm to about 2000 nm. The second doped shell 860 can be formed of, for example, $Al_xGa_{1-x}N$, where x can be any number less than 1.00 such as 0.20 or 0.30. The second doped shell 860 can be doped with a conductivity type similar to the third doped shell 870.

The third doped shell 870 can be formed by continuing the core-shell growth from the second doped shell 860 to cap the active structure device 800. The third doped shell 870 can be formed of, for example, GaN and doped to be an n-type or a p-type. In various embodiments, if the first doped shell 830 is an n-type shell, the second doped shell 860 and/or the third doped shell 870 can be a p-type shell and vice versa. In various embodiments, the third doped shell 870 can have a thickness of about 50 to about 500 nm.

Figure 9:
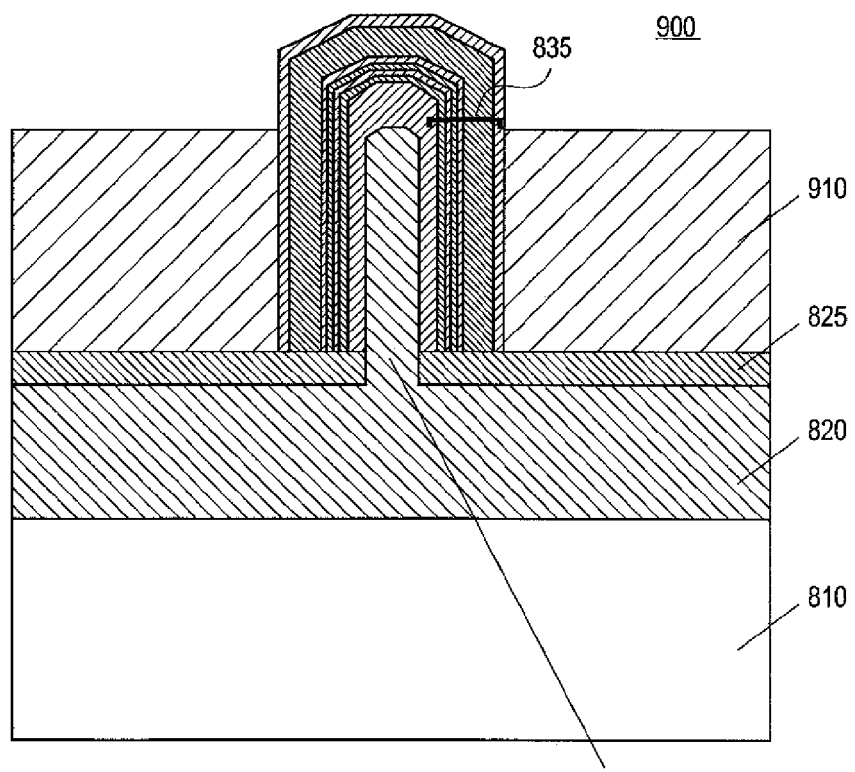
FIG. 9 depicts another exemplary core-shell nanowire/MQW active structure device in accordance with the present teachings.

In various embodiments, the core-shell active structure devices 800 shown in FIG. 8 can be electrically isolated from each other, when a number of devices 800 are included in a large area such as a wafer. FIG. 9 depicts an active structure device 900 including a dielectric material 910 deposited to isolate each core-shell nanowire/MQW active structure shown in FIG. 8 in accordance with the present teachings.

As shown in FIG. 9, the dielectric material 910 can be deposited on the selective growth mask 825 and laterally connected with the sidewalls of the shell structure 835, more specifically, the sidewalls of the third doped shell 870. In various embodiments, the dielectric material 910 can be any dielectric material for electrical isolation, such as, for example, silicon oxide ($SiO_2$), silicon nitride ($Si_3N_4$), silicon oxynitride (SiON), or other insulating materials. In some embodiments, the dielectric material 910 can be a curable dielectric. The dielectric material 910 can be formed by, for example, chemical vapor deposition (CVD) or spin-on techniques, with a desired height or thickness. In various embodiments, the height/thickness of the dielectric material 910 can be further adjusted by removing a portion of the dielectric material from the top of the deposited dielectric material using, for example, etching or lift-off procedures known to one of ordinary skill in the art. The thickness of the dielectric material 910 can be adjusted depending on specific applications where the core-shell nanowire/MQW active structure is used.

Figure 11:
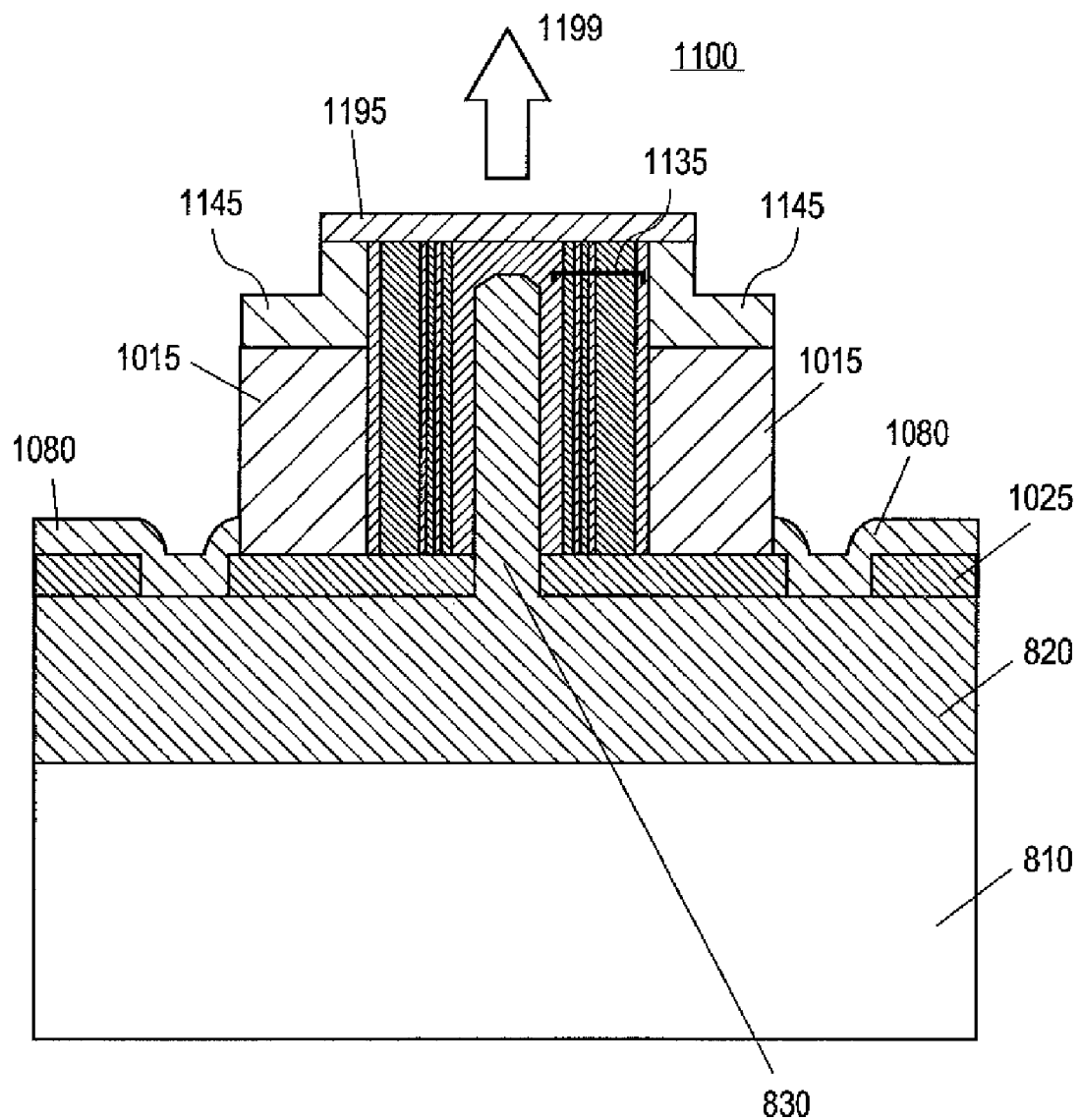
FIG. 11 depicts an exemplary nanowire laser device using the core-shell nanowire/MQW active structure described in FIGS. 8-9 in accordance with the present teachings.
Figure 12:
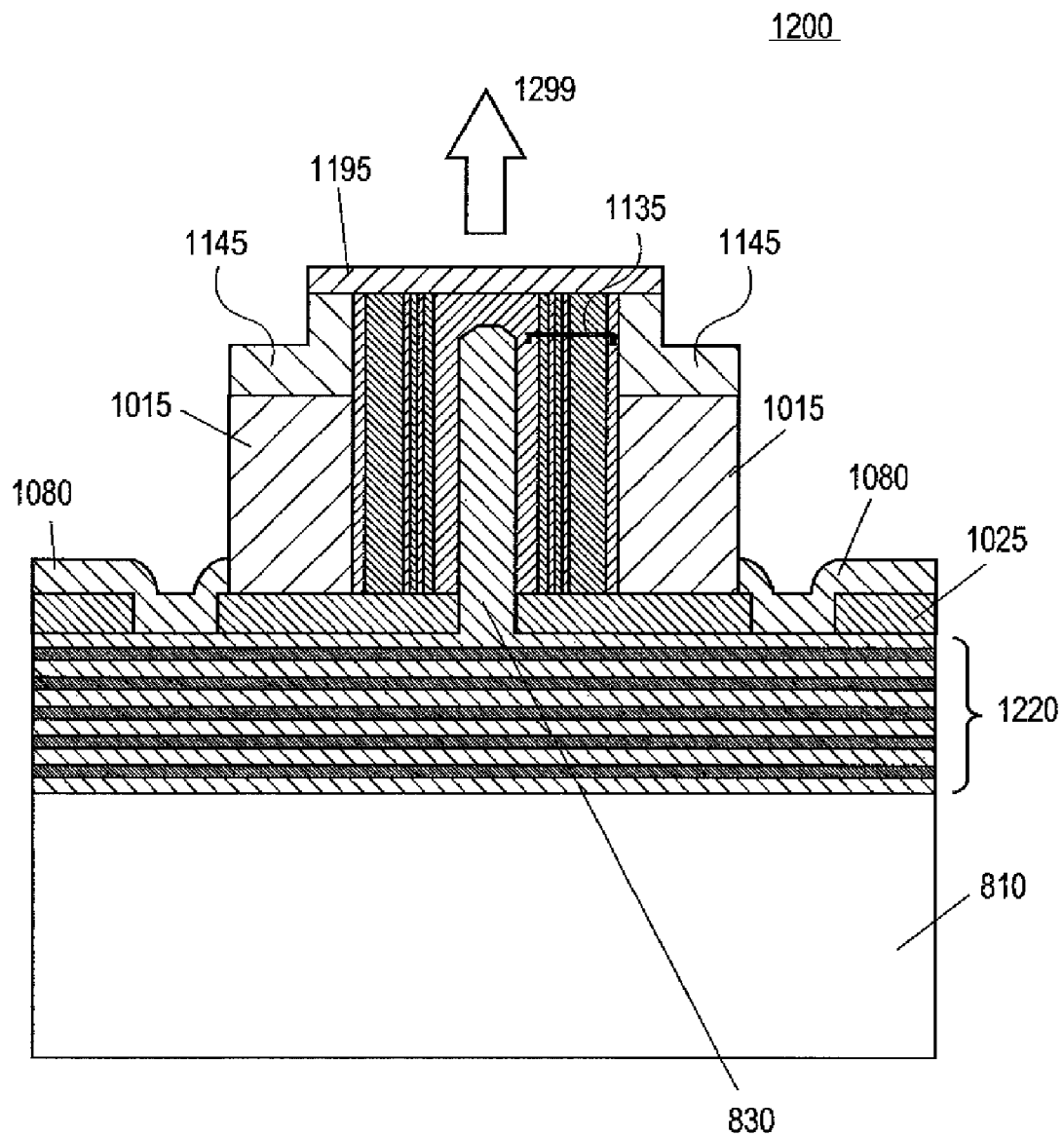
FIG. 12 depicts another exemplary nanowire laser device using the core-shell nanowire/MQW active structure described in FIGS. 8-9 in accordance with the present teachings.

In various embodiments, various nanowire LEDs and nanowire lasers can be formed by the core-shell growth described in FIGS. 8-9, because MQW active shell structures can be created on the nonpolar sidewalls of the pulsed-grown nanowires. For example, if the nanowires are arranged in a hexagonal array with a pitch that is equal to $\lambda/2$, where $\lambda$ is the emission wavelength of the exemplary LED or laser, the array of nanowires can provide optical feedback to stimulate light-emitting action. FIGS. 10-12 depict exemplary nanoscale active devices formed based on the structures shown in FIGS. 8-9 in accordance with the present teachings.

Figure 10A:
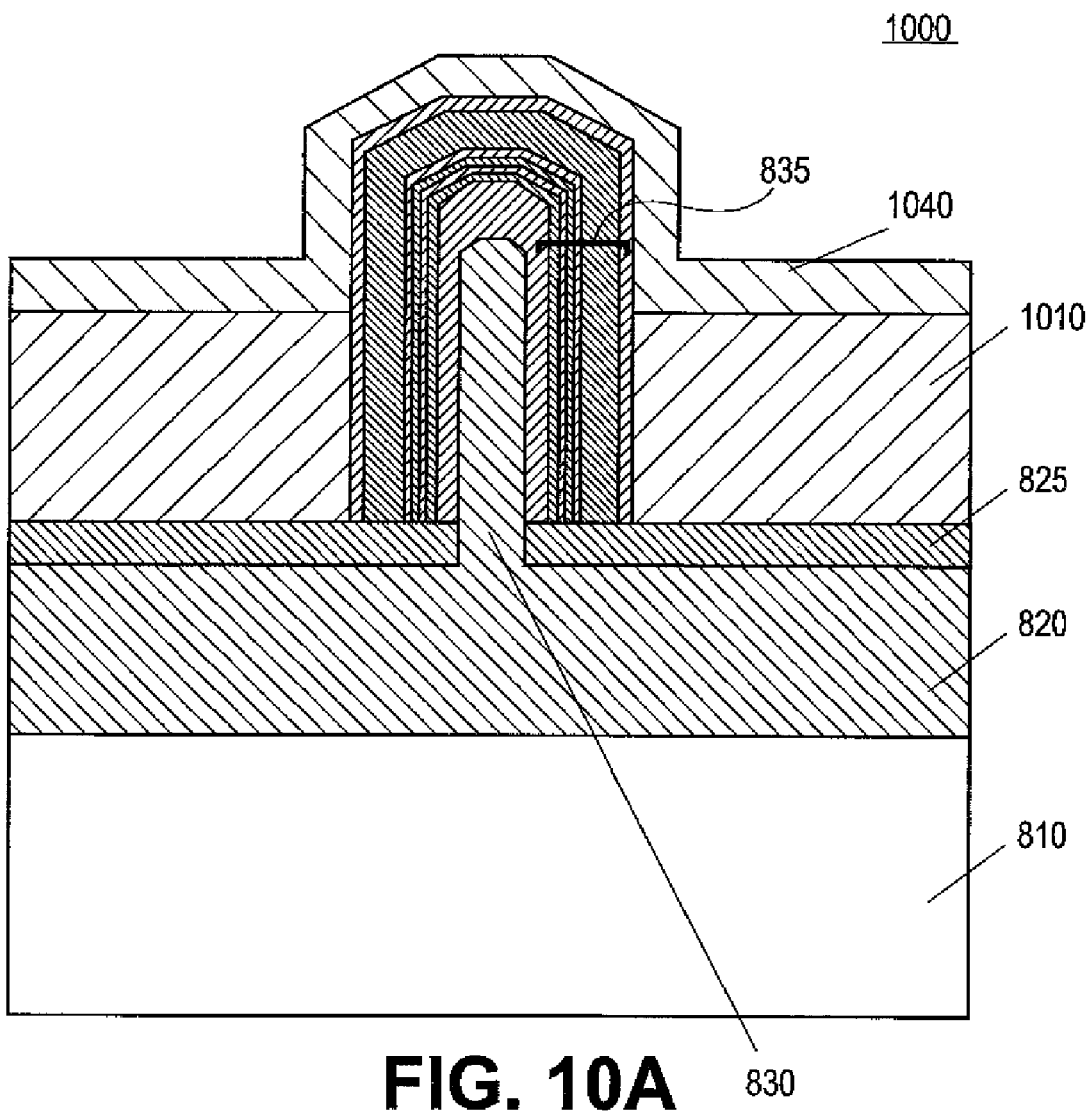
FIGS. 10A-10C depict an exemplary nanowire LED device formed using the core-shell nanowire/MQW active structure described in FIGS. 8-9 in accordance with the present teachings.
Figure 10B:
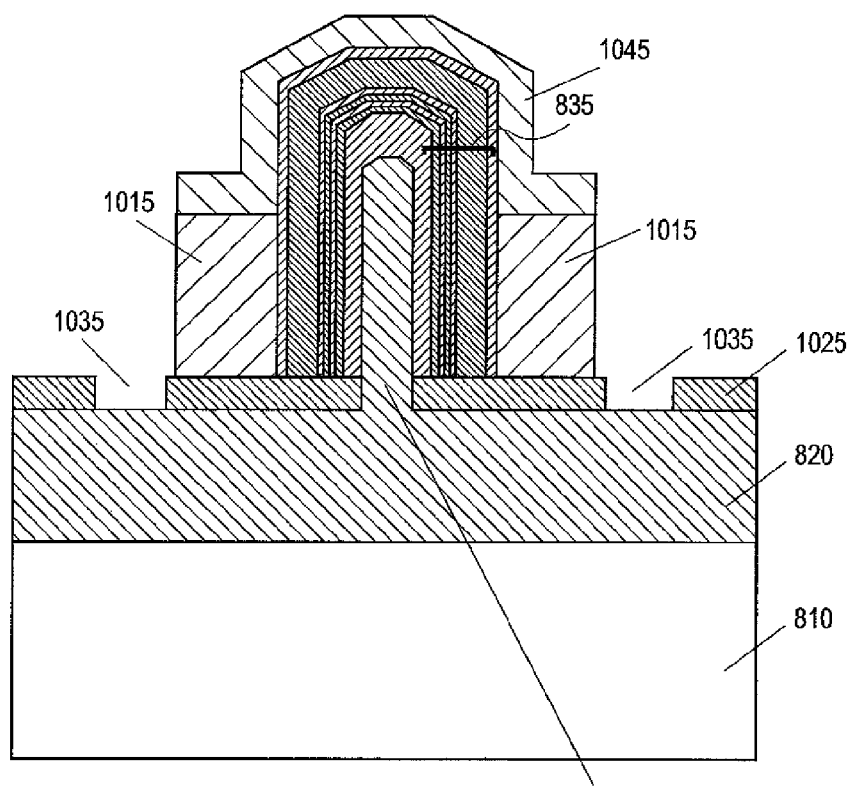
Figure 10C:
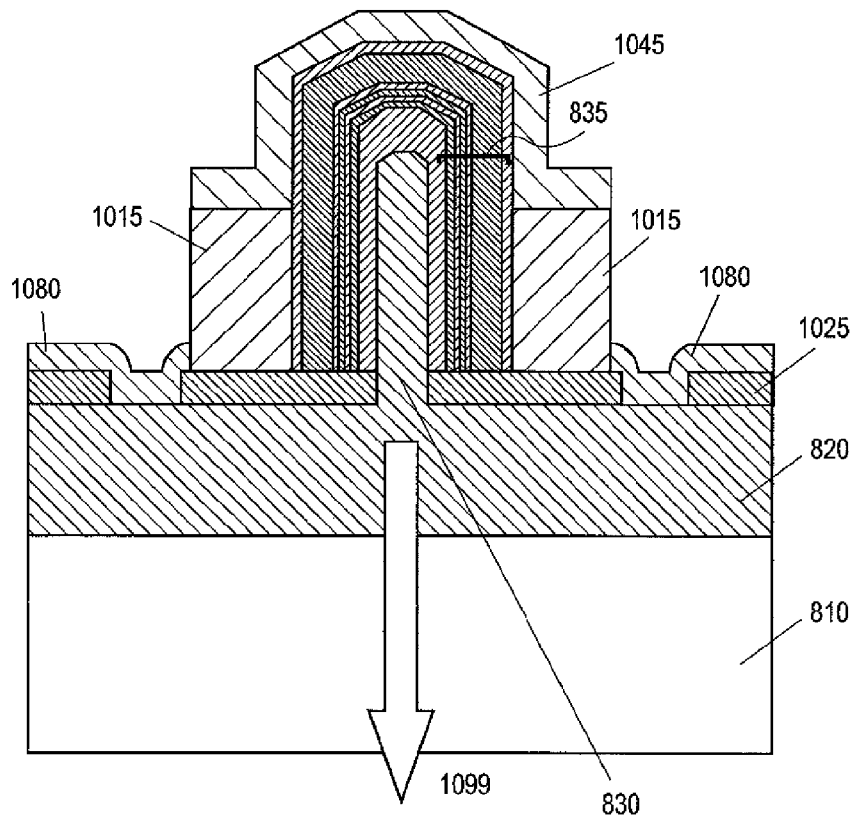

FIGS. 10A-10C depict an exemplary nanowire LED device 1000 using the core-shell nanowire/MQW active structure described in FIGS. 8-9 in accordance with the present teachings.

In various embodiments, the nanowire LED device 1000 can be fabricated including electrical contacts formed on, for example, the device 900. The electrical contacts can include conductive structures formed from metals such as titanium (Ti), aluminum (Al), platinum (Pt), nickel (Ni) or gold (Au) in a number of multi-layered combinations such as Al/Ti/Pt/Au, Ni/Au, TUN, Ti/Au, Ti/Al/Ti/Au, Ti/Al/Au, Al or Au using techniques known to one of ordinary skill in the art.

In FIG. 10A, the device 1000 can include a conductive structure 1040 formed on the surface of the device 900, i.e., on each surface of the dielectric material 910 and the third doped shell 870 of the shell structure 835. The conductive structure 1040 can be a transparent layer used for a p-electrode of the LED device 1000 fabricated subsequently. In an exemplary embodiment, the conductive structure 1040 (or p-electrode) can be, for example, a layered metal combination of Ti/Au.

In various embodiments, the device 1000 can further include a dielectric layer 1010 having an adjusted thickness (or height). By adjusting the thickness of the dielectric layer 1010, the extent (e.g., thickness or height) of the conductive structure 1040 (or p-electrode) formed on and along the sidewall of the shell structure 835 can be adjusted according to the desired application of nanowire active device. For example, a thick layer of the dielectric 1010 can confine the conductive structure 1040 (or p-electrode) to the top of the core-shell structured active devices, for example, for nanowire LEDs and/or nanowire lasers. Alternatively, an adjusted thin dielectric layer 1010 can allow the conductive structure 1040 (or p-electrode) to have a greater thickness or height (i.e., an increased extent), which can reduce the resistance of the active devices. In various embodiments, the greater thickness of the conductive structure 1040 (or p-electrode) can, however, be expected to contribute loss to an active device such as a laser cavity. As known to one of ordinary skill in the art, optimum performance of the conductive structure 1040 (or p-electrode) can be achieve by balancing the reduction of resistance of the active devices with the expected cavity loss.

In various embodiments, the thickness of the conductive structure 1040 (or p-electrode) along the sidewalls of the shell structure 835 of the exemplary LED device 1000 can be in a range of about 1 μm to about 9 μm for high efficiency performance. In various embodiments, the LED device 1000 can have a total height of, for example, about 10 μm.

In FIG. 10B, the device 1000 can further include a p-electrode 1045, a dielectric 1015, and a selective contact mask 1025 having trenches 1035 etched into the selective growth mask 825 (see FIG. 10A).

The p-electrode 1045 and the underlying dielectric 1015 can be formed by patterning and etching the conductive structure 1040 and the dielectric layer 1010 (see FIG. 10A). As a result, portions (not shown) of surface of the selective growth mask 835 can be exposed and separated by the dielectric 1015 on both sides of each core-shell structure. After the patterning and etching processes, a selective contact mask 1025 can be formed by forming trenches 1035 through the exposed portions of surface of the selective growth mask 825, wherein each side of the core-shell active structure can include at least one trench 1035. As a result, surface portions of the underlying buffer layer 820 can be used as bottoms of the trenches 1035.

In various embodiments, the thickness of the selective contact mask 1025 can be critical for the performance of the LED device 1000. For example, a silicon nitride selective growth mask having a thickness of 30 nm can be sufficiently thick to support a voltage of about 20 Volts or higher before breakdown of the LED device 1000. In various embodiments, the selective contact mask 1025 can have a thickness of about 30 nm or less. However, one of ordinary skill in the art will understand that a thicker selective growth mask can be readily accommodated in the nanowire and nanowire active device processes.

In FIG. 10C, the device 1000 can include the n-electrodes 1080 formed to assure the conduction between the n-side contact and the central conductive region including the doped buffer layer 820 and the nanowire core 830. The central conductive region can be, for example, a heavily doped $n^+$ GaN region. In various embodiments, the n-electrodes 1080 can include conductive structures formed by depositing electrode materials onto each surface of the selective contact mask 1025 and the bottoms of the trenches 1035. In an exemplary embodiment, the n-electrodes 1080 can be formed of, for example, a layered metal combination, such as Al/Ti/Pt/Au.

At 1099, the resulting light of the nanowire LED device 1000 in FIG. 10C can be extracted through the substrate 820, which can be transparent at green and blue wavelengths. In various embodiments, a more diffuse light output can occur on the top side of the device 1000 (not shown) since the nanowire LED device 1000 can be small enough for sufficient diffraction. This diffuse light output can be advantageous in some solid-state lighting applications.

In this manner, the disclosed nanowire LED device 1000 can provide unique properties as compared with traditional LED devices. First, it can have a higher brightness because the core-shell grown active region area (i.e., the MQW active shell area) can be increased, for example, by a factor of approximately 10 times compared to a conventional planar LED structure. Second, the light extraction can be improved to increase the output efficiency of the LED. This is because the LED device's geometry can make the most of the active region area oriented normal to the wafer surface, i.e., the substrate surface. The confinement regions on either side of the MQW active region can tend to guide the LED light in the vertical direction. Third, because of the high precision of the position and diameter of each of the plurality of nanowires and/or nanowire arrays, the resulting arrays of the LED devices 1000 can also be configured as a photonic-crystal, which can further improve the light output coupling efficiency. Fourth, the nanowire LED resistance can be significantly decreased because of the increase of the electrical contact area, for example, the contact area of the p-electrode 1045. Finally, since the LED device 1000 can provide a specified light power with higher brightness, more devices can be processed on a given wafer, which can decrease the cost of production and also increase the manufacturing efficiency. For example, to allow for metal contacts, the LED device 1000 can include a pitch spacing (i.e., a center-to-center spacing between any two adjacent nanowire devices) of, for example, about 100 μm. A 4-inch wafer can then include a number of nanowire LED devices 1000, for example, about 0.78 million devices or more, which can be manufactured simultaneously. In various embodiments, the pitch spacing can be reduced further to allow a single 4-inch wafer to contain, for example, more than one million LED devices 1000.

FIGS. 11-12 depict exemplary nanowire laser devices using the core-shell grown nanowire/MQW active structure shown in FIGS. 8-10 in accordance with the present teachings. Because the sidewall facets of the nanowires and/or nanowire arrays are exact $\{1\bar{1}00\}$ facets with a flatness on the scale of an atomic monolayer, high quality MQW active regions for laser devices can be formed on these superior flat "sidewall substrates." In addition, the vertical orientation of the sidewall facets, and the uniform periodicity and length of the nanowires can provide a high-throughput method of etching or cleaving facets to form an optical cavity. The uniform periodicity can allow a photonic crystal optical cavity to be established straightforwardly.

As shown in FIG. 11, the nanowire laser device 1100 can be fabricated from the processes described in FIGS. 8-10 using the core-shell grown nanowire/MQW active structure as laser active structure. The nanowire laser device 1100 can include a polished shell structure 1135, a polished p-electrode 1145, and a passivation layer 1195, which can be formed on each surface of the polished shell structure 1135 and the polished p-electrode 1145 to cap the laser active structure.

The polished shell structure 1135 and the polished p-electrode 1145 can be formed by polishing (i.e., removing) on the top end (with respect to the substrate 810 as the bottom end) of the core-shell nanowire/MQW active structure (i.e., laser active structure) such as that shown in FIG. 100. Various polishing processes, for example, a chemical-mechanical polishing, can be used using the etched dielectric 1015 as a mechanical support.

The polishing step can be used to polish a number of laser facets at the same time without diminishing the manufacturability of the nanowire laser devices 1100. For example, a number of nanowire laser devices 1100 such as about 0.78 million or more, can be formed on a 4-inch wafer for a high manufacturing efficiency. In various embodiments, the pitch spacing can be reduced further to allow a single 4-inch wafer to contain, for example, more than one million laser devices 1100.

In various embodiments, the extent (e.g., thickness or height) of the polished p-electrode 1145 formed along the sidewalls of the polished shell structure 1135 can be adjusted by adjusting thickness of the underlying etched dielectric 1015 for optimum performance of the laser device 1100. In various embodiments, the thickness of the polished p-electrode 1145 along the sidewall of the polished shell structure 1135 shown in FIG. 11 can range from about 1 μm to about 5 μm, when the overall height is about 10 μm.

The passivation layer 1195 can be formed at the polished top end of each laser active structure, i.e., on each surface of the polished p-electrode 1145 and the polished shell structure 1135. The passivation layer 1195 can be configured to avoid undue non-radiative recombination or junction leakage of the nanowire laser device 1100. In various embodiments, the passivation layer 1195 can be formed of, for example, any dielectric material known to one of ordinary skill in the art with a thickness of about 10 to about 100 nm.

In some embodiments, the composition and refractive index of the materials used for the polished shell structure 1135 surrounding the nanowire cavity (i.e., the nanowire core 830) can affect the optical lasing process at 1199. For example, when the nanowires have an exemplary diameter of about 200 nm, some of the optical lasing mode can exist outside the cavity. The laser can therefore be more sensitive to the composition and refractive index of the materials surrounding the cavity, that is, materials used for each layer of the polished shell structure 1135.

In other embodiments, because there is no physical lower facet on the laser optical cavity (i.e., the nanowire core 830), there can be a change of effective refractive index in the vicinity of the selective growth mask 1025. This index change can in fact be helped (i.e., made larger) by the fact that some of the optical lasing mode can exist outside the cavity. In an exemplary embodiment, the nanowire laser device 1100 (see FIG. 11) can be optically tuned by adjusting the thickness of the selective contact mask 1025 for a maximum reflectivity. For example, the optical thickness of the selective contact mask 1025 for the laser device 1100 can be in a range of about 220 nm to about 230 nm when the device is emitting blue light at 450 nm.

FIG. 12 depicts another exemplary laser device 1200, in which a distributed Bragg reflector (DBR) mirror stack 1220 can be disposed between the layers of the substrate 810 and the selective growth mask 1025, as opposed to the doped buffer layer 820 being disposed between these two layers of the laser device 1100 shown in FIG. 11.

The DBR mirror stack 1220 can be an epitaxial DBR mirror stack. The DBR mirror stack 1220 can include, for example, quarter-wave alternating layers of, for example, GaN and AlGaN. In various embodiments, the DBR mirror stack 1220 can be tuned to improve reflectivity and to increase cavity Q of the laser 1299.

In various embodiments, all the nanowire active devices shown in FIGS. 10-12 can provide a low device resistance because more resistive p-electrodes (e.g., the p-electrode 1045 and/or 1145) of the heterostructure can be located at the larger-area, which is outer periphery of each core-shell nanowire/MQW active structure. For example, for the LED device 1000 (shown in FIG. 10), the p-electrode 1045 can be patterned to completely cover the top of the device 1000 to further decrease the device resistance.

Although a single nanowire is depicted in FIGS. 8-12 for the purpose of description, one of ordinary skill in the art will understand that the core-shell growth processes on each nanowire of the plurality of nanowires and/or nanowire arrays (e.g., shown in FIGS. 1-6) for nanoscale active devices can be simultaneously conducted in a large area (e.g., a whole wafer).

Various embodiments can be extended to encompass high-quality (e.g., defect free) thin-walled structures deposited in the patterned apertures (e.g., 1338 of FIG. 13A or 1438 of FIG. 14A) of a selective growth mask (e.g., 135 of FIG. 1A, FIG. 13A or FIG. 14A), followed by the pulsed growth as disclosed herein. The patterned aperture can have at least one of the lateral dimensions be small enough to allow bending and termination of threading defects (TDs) at the sidewalls of the resulting thin-walled structures. For example, semiconductor materials such as group III-N materials of GaN can be grown in desired patterned apertures (e.g., 1338 of FIG. 13A or 1438 of FIG. 14A) using the non-pulsed selective growth mode, followed by the pulsed growth of GaN, forming the thin-walled structure.

Figure 13:
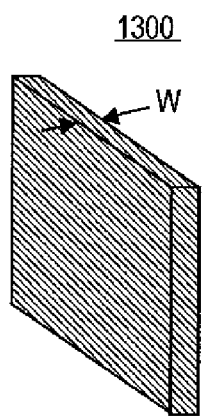
FIG. 13 depicts an exemplary thin-walled structure in accordance with the present teachings.
Figure 13A:
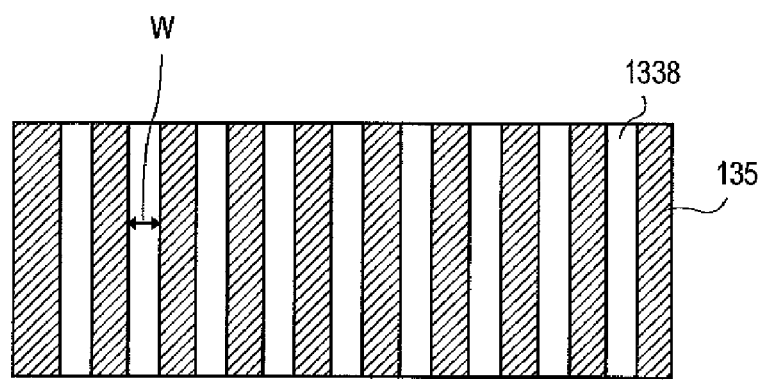
FIG. 13A depicts a top view of an exemplary patterned aperture for the fabrication of the thin-walled structure of FIG. 13 in accordance with the present teachings.
Figure 14:
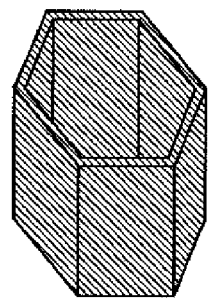
FIG. 14 depicts another exemplary thin-walled structure in accordance with the present teachings.
Figure 14A:
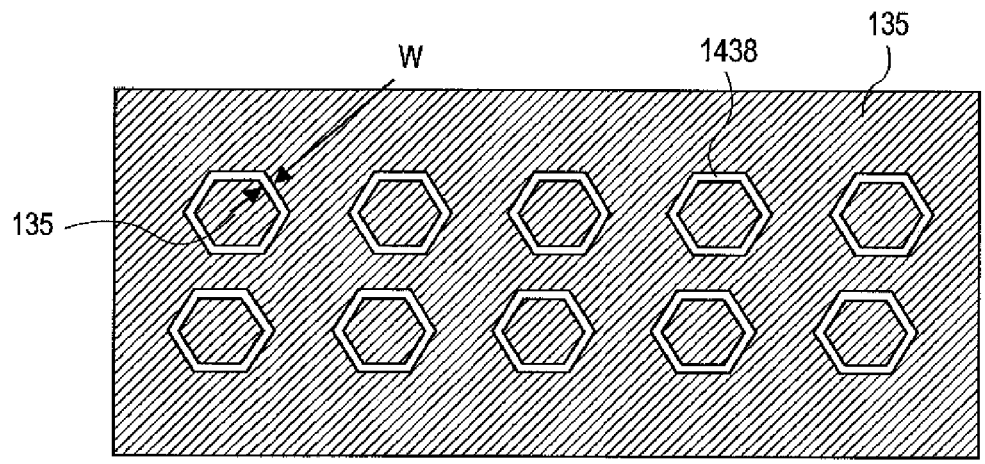
FIG. 14A depicts a top view of an exemplary patterned aperture for the fabrication of the thin-walled structure of FIG. 14 in accordance with the present teachings.

The patterned apertures, as described herein, can include apertures having at least one lateral dimension of, e.g., about 1 micrometer or less, in the selective growth mask (e.g., 135 of FIG. 1A, FIG. 13A or FIG. 14A). Other lateral dimensions of the apertures can have a size, e.g., on order of 10 or 100 micrometers, or even on the order of millimeters.

Accordingly, the thin-walled structure, initially formed in the patterned aperture from the non-pulsed selective growth, can have at least one lateral dimension of, e.g., about 1 micrometer or less, and can have other lateral dimensions in a size, e.g., on order of about 10 or 100 micrometers, or even on the order of millimeters. The pulsed growth can allow a continuous growth of the thin-walled structure in an orthogonal direction until a desired length is reached. In various embodiments, the length of the thin-walled structures can be determined by specific applications and the lateral dimensions of the thin-walled structures.

The thin-walled structure can have one or more side walls depending on their lateral cross sectional shape. The side walls may or may not be perpendicular to the lateral cross section of the thin-walled structure. Accordingly, the thin-walled structure can have a minimum lateral dimension (also referred to as a lateral sidewall width W) of about 1 micron or less. In various embodiments, the thin-walled structures can have a length of, for example, about 1 μm or higher. In an additional example, the length of each thin-walled structure can be about 100 μm to about 10 mm.

In an exemplary embodiment, the thin-walled structures can be thin-walled nanowire structures having at least one minimum lateral dimension W of about 500 nm or less, such as about 100 nm to about 300 nm. In various embodiments, the thin-walled nanowire structures can have a length of, for example, about 10 nm to about 1000 microns. In an additional example, the length of each thin-walled nanowire structure can be about 10 nm to about 10 mm.

FIGS. 13-14 depict exemplary thin-walled structures fabricated using the disclosed two-phase growth mode in accordance with the present teachings. In various embodiments, the thin-walled structures can have asymmetric or symmetric lateral cross sections. For example, the thin-walled structure 1300 of FIG. 13 depicts a thin wall (e.g., a thin-walled line structure) having at least one lateral dimension of about 1000 nm or less. In an additional example, the thin wall can have at least one lateral dimension of about 500 nm or less.

In other embodiments shown in FIG. 14, the thin-walled structure 1400 can include a thin-walled hollow structure having an inner diameter and an outer diameter determined by the lateral thickness/width of the sidewall. The thin-walled hollow structure can include a minimum lateral width of about 1000 nm or less. The lateral cross section of the thin-walled hollow structure can be asymmetric or symmetric and can include, e.g., thin-walled rectangular, thin-walled polygonal, thin-walled square, thin-walled oval, or thin-walled circular lateral shapes.

Various embodiments can also include thin-walled structure arrays, wherein the thin-walled structures, e.g., as those shown in FIG. 13 or FIG. 14, can be arranged, for example, substantially parallel, arcuate, and/or sinusoidal, with respect to each other.

The fabrication process for the thin-walled structures 1300 and 1400 can be similar to those described in FIGS. 1A-1C, FIG. 2, FIGS. 4A-4C and FIG. 5 using desired patterned apertures for the non-pulsed selective growth mode, followed by the pulsed growth mode as described herein. The patterned apertures can have a cross section shape same or different from that shown in FIGS. 1A-1C and in FIGS. 4A-4C.

Figure 13B:
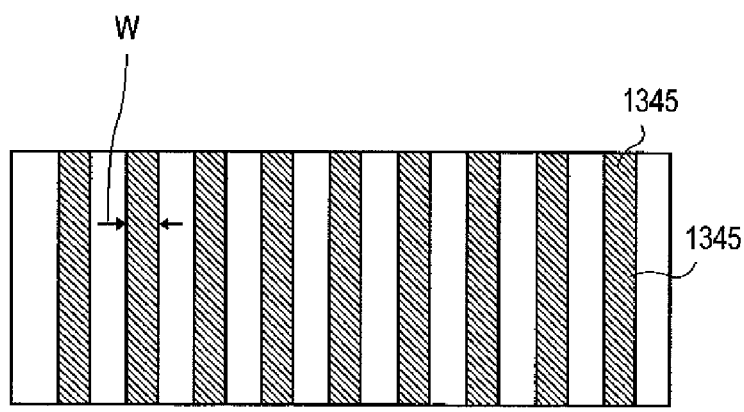
FIG. 13B depicts a top view of the fabricated thin-walled structure of FIG. 13 with respect to the fabrication process shown in FIG. 1C in accordance with the present teachings.

For example, a top view of patterned apertures 1338 for the fabrication of the exemplary thin-walled line structure 1300 is shown in FIG. 13A. In one embodiment, the fabrication process can be similar to that shown in FIGS. 1A-1C. For example, a selective growth mask (e.g., 135 of FIG. 1A, or FIG. 13A) can be formed over a substrate (e.g., 110 of FIG. 1A, or 120 of FIG. 2), wherein the selective growth mask 135 can include a plurality of patterned apertures 1338 (see FIG. 13A) to expose a plurality of surface portions of the underlying substrate. A semiconductor material including, e.g., GaN, AlN, InN, InGaN, AlInGaN or AlGaN, can be grown on each exposed portion of the substrate and in each patterned aperture 1338 using a selective non-pulsed growth mode. A growth-mode transition can then be performed from the non-pulsed growth mode to a pulsed growth mode to continue the growth of the semiconductor material and whereby forming the thin walled line structure. In various embodiments, the pulsed growth mode can be applied before (as shown in FIGS. 1-2) or after (as shown in FIGS. 3-4) the growth of the semiconductor material protrudes over a top of the selective growth mask. FIG. 13B depicts a top view of the formed thin walled line structure having a lateral sidewall width W with respect to the fabrication step shown in FIG. 1C.

Figure 14B:
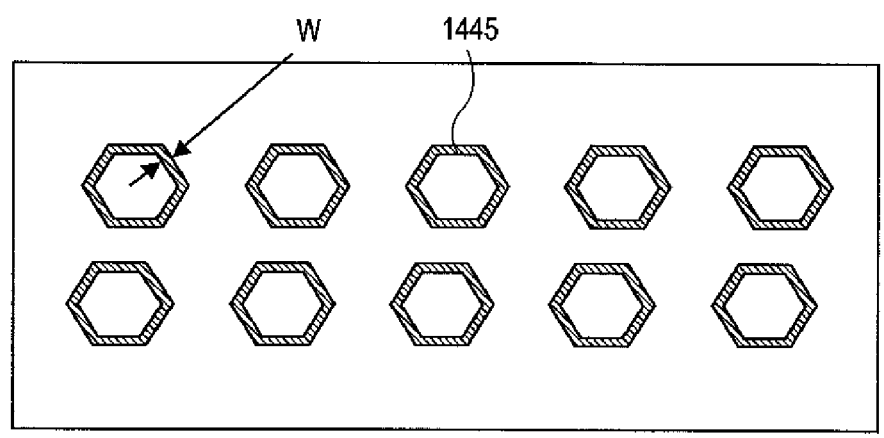
FIG. 14B depicts a top view of the fabricated thin-walled structure of FIG. 14 with respect to the fabrication process shown in FIG. 1C in accordance with the present teachings.

In another example, a top view of the patterned apertures 1438 for the fabrication of the exemplary thin-walled hollow structure 1400 is shown in FIG. 14A. The exemplary patterned aperture 1438 can have a hexagonal lateral cross sectional shape having a sidewall width W formed in, e.g., the selective growth mask 135 of FIG. 1A. The selective growth mask 135 can be formed over a substrate (e.g., 110 of FIG. 1A or 120 of FIG. 2), wherein the patterned apertures 1438 (see FIG. 14A) can expose surface portions of the underlying substrate. The semiconductor material including, e.g., GaN, AlN, InN, InGaN, AlInGaN or AlGaN, can be grown on each exposed portion of the substrate and in each patterned aperture 1438 using a selective non-pulsed growth mode. A growth-mode transition can then be performed from the non-pulsed growth mode to a pulsed growth mode to continue the growth of the semiconductor material and whereby forming the thin-walled hollow structure 1400. In various embodiments, the pulsed growth mode can be applied before (as shown in FIGS. 1-2) or after (as shown in FIGS. 3-4) the growth of the semiconductor material protrudes over a top of the selective growth mask. FIG. 14B depicts a top view of the formed thin-walled hollow structure having a lateral sidewall width W with respect to the fabrication step shown in FIG. 1C.

While not intending to be bound by any particular theory, it is believed that the use of at least one small lateral dimension of the patterned apertures for the selective growth can allow threading defects (TDs) to be bent and terminated at the sidewall(s) of the growing thin-walled structures. This is because a shorter TD has a lower energy which nature favors. In various embodiments, such TD bending and termination can even be observed for some TDs when the dimensions of thin-walled structures are on order of 10 microns.

In various embodiments, the formed thin-walled structure can also be used to form high-quality group III-N structures, for example, high-quality GaN structures, by terminating and coalescing the plurality of thin-walled structures and/or thin-walled structure arrays, as similarly described in FIGS. 7A-7D. These GaN structures can be much larger and can be used as large GaN substrate structures to facilitate the fabrication of high power GaN-based devices, such as high power visible LEDs and lasers for the emerging solid-state lighting and UV sensor industries.

Additionally, the pulsed-grown thin-walled structures can also be applied to a core-shell growth to build a MQW active shell structure or other desired device structure on the sidewalls of each thin-walled structure. For example, the structures 1300 and 1400 can be used as the core structures to form core-shell MQW active structures as those similarly described for the device 800, 900, 1000, 1100, and 1200 in FIGS. 8-12. Various materials, such as, for example, AlGaN, InGaN, AlInGaN, GaN, AlN, or InN, can be used for the MQW active structures and various devices, such as, for example, MQW InGaN/GaN LEDs, lasers, GaN-based high electron mobility transistors (HEMTs) or other devices of interest can be formed.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of forming a thin-walled structure comprising:
   forming a selective growth mask over a substrate, wherein the selective growth mask comprises a plurality of patterned apertures;
   forming a thin-walled structure on the substrate by disposing a semiconductor material in each patterned aperture using a non-pulsed growth mode; and
   growing the thin-walled structure using a pulsed growth mode of the semiconductor material, wherein the thin-walled structure comprises a hollow shape having a wall thickness.

2. The method of claim 1, wherein at least one lateral dimension of each patterned aperture is about 1 micron or less.

3. The method of claim 1, wherein at least one lateral dimension of each patterned aperture is about 500 nm or less to form a thin-walled nanowire structure.

4. The method of claim 1, wherein the thin-walled structure has a length of about 1 micron to about 10 mm.

5. The method of claim 1, wherein the wall thickness is about 1000 nm or less.

6. The method of claim 1, wherein the thin-walled structure comprises a thin-walled hollow structure having a lateral cross section selected from the group consisting of a thin-walled polygon, a thin-walled rectangle, a thin-walled square, a thin-walled oval, and a thin-walled circle.

7. The method of claim 1, wherein the substrate comprises one or more materials selected from the group consisting of Si, SiC, sapphire, GaN and GaAs.

8. The method of claim 1, wherein the pulsed growth mode is applied before or after growth of the semiconductor material protrudes over a top of the selective growth mask.

9. The method of claim 1, wherein the semiconductor material for forming the thin-walled structure comprises one or more materials selected from the group consisting of GaN, AlN, InN, InGaN, AlInGaN and AlGaN.

10. A group III-N thin-walled structure formed according to the method of claim 1.

11. The method of claim 1, further comprising forming a group III-N substrate structure by terminating and coalescing one or more formed thin-walled structures.

12. The method of claim 1, further comprising forming a multiple quantum well (MOW) active structure on one or more sidewalls of the formed thin-walled structure, the thin-walled structure being used as a core structure.

13. A group III-N substrate structure formed by the method of claim 11.

14. The method of claim 12, wherein the MOW active structure comprises one or more materials chosen from AlGaN, InGaN, AlInGaN, GaN, AlN, and InN.

15. A thin-walled structure comprising:
   a selective growth mask disposed over a substrate, wherein the selective growth mask comprises a plurality of patterned apertures with each patterned aperture exposing a surface portion of the substrate; and
   a thin-walled structure connected to and extending from the surface portion of the substrate and through each patterned aperture, wherein the thin-walled structure comprises a hollow shape having a wall thickness of 1000 nm or less.

16. The structure of claim 15, wherein the at least one lateral dimension of each patterned aperture is about 1 micron or less.

17. The structure of claim 15, wherein the at least one lateral dimension of each patterned aperture is about 500 nm or less for a thin-walled nanowire structure.

18. The structure of claim 15, wherein the thin-walled structure has a length of about 1 micron or longer extended from the substrate surface.

19. The structure of claim 15, wherein the thin-walled structure comprises a thin wall, a thin-walled polygon, a thin-walled rectangle, a thin-walled square, a thin-walled oval, or a thin-walled circle.

20. A multiple quantum well (MQW) active structure disposed on one or more sidewalls of the thin-walled structure of claim 15, to form a core-shell active structure for a device comprising a light emitting diode (LED), a laser, or a high electron mobility transistor (HEMT).

* * * * *